US010387588B1

(12) United States Patent
Gottin et al.

(10) Patent No.: US 10,387,588 B1
(45) Date of Patent: Aug. 20, 2019

(54) AUTOMATIC COMBINATION OF SUB-PROCESS SIMULATION RESULTS AND HETEROGENEOUS DATA SOURCES

(71) Applicant: EMC Corporation, Hopkinton, MA (US)

(72) Inventors: Vinicius Michel Gottin, Rio de Janeiro (BR); Angelo E. M. Ciarlini, Rio de Janeiro (BR); André de Almeida Maximo, Rio de Janeiro (BR); Adriana Bechara Prado, Rio de Janeiro (BR); Jaumir Valença da Silveira Junior, Rio de Janeiro (BR)

(73) Assignee: EMC Corporation, Hopkinton, MA (US)

( * ) Notice: Subject to any disclaimer, the term of this patent is extended or adjusted under 35 U.S.C. 154(b) by 400 days.

(21) Appl. No.: 15/223,472

(22) Filed: Jul. 29, 2016

(51) Int. Cl.
*G06F 16/245* (2019.01)
*G06F 17/18* (2006.01)
*G06F 17/50* (2006.01)

(52) U.S. Cl.
CPC ........ *G06F 17/5009* (2013.01); *G06F 16/245* (2019.01); *G06F 17/18* (2013.01)

(58) Field of Classification Search
CPC . G06F 17/5009; G06F 17/18; G06F 17/30424
USPC .............................................................. 703/2
See application file for complete search history.

(56) References Cited

U.S. PATENT DOCUMENTS 8,874,615 B2 * 10/2014 Prieditis ............ G06F 17/30536 707/791

OTHER PUBLICATIONS

Richard M. Fujimoto, "Parallel discrete event simulation", 1990, Communications of the ACM 33.10, pp. 30-53.*
Richard M. Fujimoto, Parallel and Distributed Simulation, 1999, Proceedings of the 1999 Winter Simulation Conference, pp. 122-131.*

(Continued)

*Primary Examiner* — Juan C Ochoa
(74) *Attorney, Agent, or Firm* — Ryan, Mason & Lewis, LLP

(57) ABSTRACT

Methods and apparatus are provided for automatic combination of sub-process simulation results and heterogeneous data sources. An exemplary method comprises obtaining, for a process comprised of a sequence of a plurality of sub-processes, an identification of relevant input and output features for each sub-process; obtaining an execution map for each sub-process, wherein each execution map stores results of an execution of a given sub-process; and, in response to a user query regarding a target feature and a user-provided initial scenario: composing a probability distribution function for the target feature representing a simulation of the process based on a sequence of the execution maps, by matching input features of each execution map with features from the initial scenario or the output of previous execution maps; and processing the probability distribution function to answer the user query. Execution maps are optionally stored as distributed tables that use relevant input features to hash data related to multiple executions across multiple nodes. The composition process optionally occurs in parallel across multiple nodes.

20 Claims, 23 Drawing Sheets

(56) References Cited

OTHER PUBLICATIONS

Augusto Cesar Espindola Baffa and Angelo EM Ciarlini, "Modeling POMDPs for generating and simulating stock investment policies", 2010, Proceedings of the ACM Symposium on Applied Computing, pp. 1-6.*

Augusto C.E. Baffa and Angelo E.M. Ciarlini, "Planning under the uncertainty of the technical analysis of stock markets", 2010, Ibero-American Conference on Artificial Intelligence, Springer, Berlin, Heidelberg, pp. 110-119.*

* cited by examiner

500

| $M_1^A$ | | | |
|---|---|---|---|
| $\mathbb{I}_1^A$ month | c | $\mathbb{O}_1^A$ (avg_process_time, | rt_containers) |
| (jan) | 5 | (50h, | 20%) |
| | 10 | (50h, | 80%) |
| | 15 | (100h, | 20%) |
| | 15 | (100h, | 80%) |

| $M_1^X$ | | | |
|---|---|---|---|
| $\mathbb{I}_1^X$ month | $c$ | $\mathbb{O}_1^X$ ($avg\_process\_time$, | $rt\_containers$) |
| ($jan$) | 5 | (50$h$, | 20%) |
| | 10 | (50$h$, | 80%) |
| | 10 | (100$h$, | 20%) |
| | 5 | (100$h$, | 80%) |
| ($feb$) | 05 | (50$h$, | 20%) |
| | 10 | (75$h$, | 20%) |
| | 40 | (100$h$, | 20%) |
| | 20 | (125$h$, | 20%) |

| $M_1^{AX}$ | | | |
|---|---|---|---|
| $\mathbb{I}_1^{AX}$ month | c | $\mathbb{O}_1^{AX}$ (avg_process_time, | rt_containers) |
| (jan) | 10 | (50h, | 20%) |
| | 20 | (50h, | 80%) |
| | 25 | (100h, | 20%) |
| | 20 | (100h, | 80%) |
| (feb) | 05 | (50h, | 20%) |
| | 10 | (75h, | 20%) |
| | 40 | (100h, | 20%) |
| | 20 | (125h, | 20%) |

```
Compose(mapSeq, t, scenario, funcs):
    (future_feat, next_feat) = CollectFeatures(mapSeq, t)
    initial_scenario = GenerateInitialScenario(scenario)
    initial_hist = [(1, initial_scenario)]
    final_hist = CombineHistogram (initial_hist, mapSeq, future_feat, next_feat, funcs)
    probability_function = GeneratePDF(final_hist)
    return probability_function
```

```
GeneratePDF(hist):
    total_counts = 0
    for (c, Q) in hist:
        total_counts = total_counts + c
    res_hist = []
    for (c, Q) in hist:
        append(res_hist, (c / total_counts, Q)
    return res_hist
```

```
CombineHistogram(hist, mapSeq, future_feat, next_feat, funcs):
    if mapSeq == [ ]:
        return hist
    current_map ← head(mapSeq)
    current_feat ← head(future_feat)
    next_hist ← new_histogram(head(next_feat))
    for each (c_i, Q_i) in hist:
        for each (c_j, Q_j) in current_map[Q_i]:
            c_n ← c_i * c_j
            Q_n ← merge(Q_i, Q_j, head(funcs))
            append(next_hist, (c_n, Q_n))
    group_by(next_hist, current_feat )
    return CombineHistogram(next_hist, tail(mapSeq), tail(future_feat), tail(next_feat), tail(funcs))
```

| $M_2^B$ | | |
|---|---|---|
| $\mathbb{I}_2^B$ *rt_containers* | $c$ | $\mathbb{O}_2^B$ (*avg_process_time*) |
| (20%) | 10 | (10$h$) |
| | 20 | (30$h$) |
| | 10 | (60$h$) |
| (80%) | 15 | (30$h$) |
| | 10 | (40$h$) |
| | 05 | (50$h$) |

FIG. 12

AUTOMATIC COMBINATION OF SUB-PROCESS SIMULATION RESULTS AND HETEROGENEOUS DATA SOURCES

FIELD

The field relates generally to simulation of combinatorial processes, such as logistics processes, and more particularly, to techniques for summarizing and querying data related to such simulations.

BACKGROUND

Simulations generally encompass a set of sequential sub-processes. One example where simulations are employed is in supply chain logistics, where the goal is to move assets (e.g., equipment, materials and/or food) from a supplier to a customer, passing through one or more places, and potentially involving people and machines. The term logistics refers to the management of resources to accomplish such a goal. Useful information in supply chain logistics typically includes: suppliers, features of products and services; people and machines involved; and time to finish each activity. Such data can be obtained and manipulated directly by means of statistical analysis, as commonly done in the business intelligence area, or indirectly via simulations.

Simulations are typically used to help make decisions. In the supply chain logistics example, simulations provide the ability to observe one or more sub-processes that yield results without actually performing the related activities in the real world. Typically, the level of detail of the entire simulation process is chosen based on the target features of the simulation, e.g., specific simulation behaviors that can be quantified and are important for subsequent analysis and decision making.

Simulation applications may be very complex, and in order to capture the workings of the system, it might be necessary to run each simulation a very large number of times. Thus, extreme computational costs are implied and Big Data strategies are often required.

A need therefore exists for techniques for combining results of previous simulations of portions of a simulated process.

SUMMARY

Illustrative embodiments of the present invention provide methods and apparatus for automatic combination of sub-process simulation results and heterogeneous data sources. In one exemplary embodiment, a method comprises the steps of obtaining, for a process comprised of a sequence of a plurality of sub-processes, an identification of one or more relevant input features and output features for each of the sub-processes; obtaining at least one execution map for each of the sub-processes, wherein each execution map stores results of at least one execution of a given sub-process originated from at least one data source, and wherein the results indicate a count of a number of times a given tuple of output features appeared given a substantially same tuple of input features; and, in response to one or more user queries regarding at least one target feature, selected among features of the sub-processes, and a user-provided initial scenario comprising values of the one or more relevant input features of a first sub-process, performing the following steps: composing a probability distribution function for the at least one target feature that represents a simulation of the process based on a sequence of the execution maps, one for each of the sub-processes, by matching the input features of each execution map with features from either the initial scenario or from the output of previous execution maps in the sequence; and processing the probability distribution function to answer the one or more user queries for the target feature.

In at least one embodiment, the execution maps for each of the plurality of sub-processes are stored as distributed tables that use the relevant input features to hash data related to multiple executions across multiple nodes, and wherein the composition process occurs in parallel across multiple nodes.

In one or more embodiments, the probability distribution function comprises a probability mass function and wherein, when one or more of the target features are continuous, the system further comprising the step of generating an approximation for a continuous probability density function based on the probability mass function. The probability distribution function for the at least one target feature is generated from the at least one execution map for each of the sub-processes selected based on a confidence level of the results in each execution map.

As noted above, illustrative embodiments described herein provide significant improvements relative to conventional simulation systems by for combining results of previous simulations of portions of a simulated process. These and other features and advantages of the present invention will become more readily apparent from the accompanying drawings and the following detailed description.

BRIEF DESCRIPTION OF THE DRAWINGS

FIG. 5 illustrates a table comprising an execution map constructed from source A implementing a particular sub-process, following the example of FIG. 4;

FIG. 6 illustrates a table comprising an additional execution map, extracted from a database table, with equivalent input and output schemas as the execution map of FIG. 5;

FIG. 7 illustrates a table representing an execution map composed from the execution maps of FIGS. 5 and 6, extracted from heterogeneous data sources;

FIG. 9 illustrates exemplary pseudo code of a compose process according to one embodiment of the invention;

FIG. 10 illustrates exemplary pseudo code of a Generate PDF process according to one embodiment of the invention;

FIG. 11 illustrates exemplary pseudo code of a Combine Histogram process according to one embodiment of the invention;

FIGS. 12 through 20 present an example to illustrate the algorithms of FIGS. 9 through 11;

DETAILED DESCRIPTION

Figure 1:
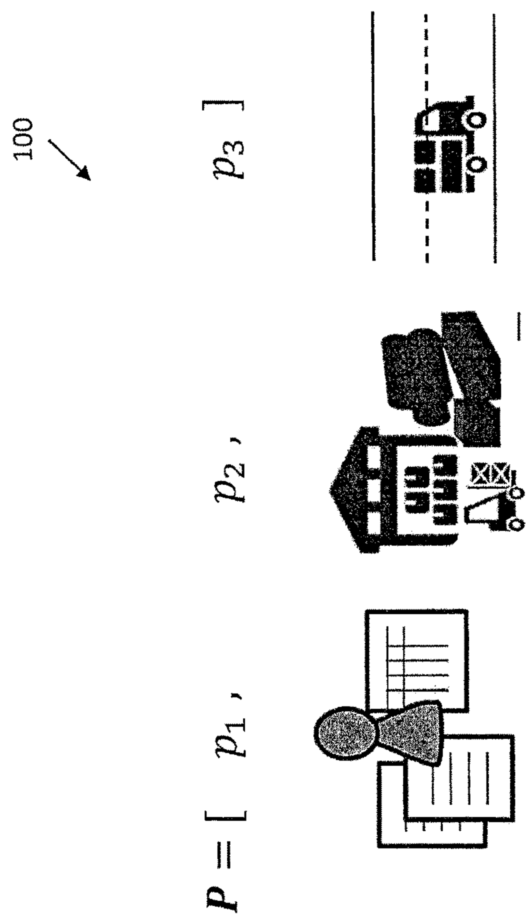
FIG. 1 illustrates an exemplary supply chain logistics domain comprised of three sequential non-overlapping sub-processes.

Illustrative embodiments of the present invention will be described herein with reference to exemplary communication, storage, and processing devices. It is to be appreciated, however, that the invention is not restricted to use with the particular illustrative configurations shown. Aspects of the present invention provide methods and apparatus for automatic combination of sub-process simulation results and heterogeneous data sources.

One or more embodiments of the invention analyze results in scenarios that have not been simulated by combining the results of previous simulations of parts of the process, for example, in an embarrassingly parallel fashion. In one or more embodiments, computer-based simulation of a sequence of one or more sub-processes is performed. While one or more embodiments are described in the context of supply chain logistics, the present invention may be employed in any environment where it is desirable to analyze results in scenarios that have not been simulated by combining the results of previous simulations of portions of the process.

In at least one embodiment, histograms originated from multiple, heterogeneous data sources, such as results for various sub-processes from different simulators and/or from real-world data, are combined to enable, improve and/or speed up simulations of the complete process. In this way, by leveraging a massively parallel approach in one or more exemplary embodiments, combined simulations can be created that extrapolate what could happen, something that is useful, for example, to obtain quick results when it is not viable to create a new unified simulation model of the entire process from scratch.

One or more embodiments of the invention provide a method for storing the results of computational simulations, datasets, user-input data or any other data source in a unified format, referred to herein as an execution map, that indexes the values of domain features by the scenarios in which they were attained. In at least one embodiment, the method relies on user-provided domain knowledge to define the features of interest in the domain that ultimately compose the maps. When the users specify such features they define hypothesis about what can influence each sub-process. The method then provides the means to extrapolate the combination of the available data sources and to guarantee coherence of the combined model.

One or more embodiments of the invention provide a method, leveraging the execution map representation, for efficiently combining diverse sources into a probability distribution function of a target feature of interest. In at least one embodiment, the method provides a specialist user with a simulation model of the target feature over the complete process, which can be used to quickly query simulation results that have not been simulated in a single run. In addition, the exemplary method can provide results even when no feasible model is readily available. In at least one embodiment, the method applies massive parallelism to efficiently allow the user to query the probability of values of the target feature in scenarios that were not previously simulated for the entire process, but can be extrapolated with coherence guaranteed by the matching of the input and output features in the maps.

One or more embodiments of the invention provide a method, leveraging the execution map representation, for the generation of additional, aggregated, combined sources of a same sub-process with similar schemas. This allows the combination of heterogeneous data sources representing the same sub-process, and mitigates the need to run every simulator a large number of times.

In one or more embodiments, the disclosed methods are also useful when there is already a unified simulation but it could take a long time to simulate new situations and this would demand large amounts of storage and other computational resources. The level of accuracy of such extrapolations can be substantially guaranteed by correctly specifying features that connect the different processes. Within the context of simulations that generate large amounts of data, the application of such techniques leverages decision-making capabilities.

Simulation of processes, such as supply chain logistics processes, is of broad interest to the industry. These simulations can be arbitrarily complex and demand large amounts of storage and other computational resources. In this context of heterogeneous simulations, the following problems may arise.

Running Complex Simulations

Highly detailed models are expensive to simulate in terms of computational resources. As an example, in the area of computer-based simulation, it is not rare to have simulation runs taking hours or even days to complete, requiring an enormous amount of memory and storage. Additionally, since the possibility space of a nondeterministic simulation model can be arbitrarily wide, which is often the case, large amounts of simulation traces are necessary in order to generate results that cover a relevant number of possible cases.

The cost related to the execution of a large number of simulation traces may render the usage of one big and complex simulation impractical if results are needed under time or computational resources constraints.

Building Simulation Models for Complex Domains

Building simulation models for decision making purposes over a complex process may demand prohibitive costs and resources. Although the details and level of granularity of the model contribute to the quality of the simulation results, they may be expensive to be acquired. This also means that the longer the sequence of sub-processes to be simulated, the higher the cost of building a simulation model. Building a simulation model is a naturally iterative activity, depending on analyses by domain experts and statistical verifications of properties. These iterations require that the simulation model be executed several times at every intermediate modeling stage, which relates this problem to the problem of computational costs of running complex simulations.

Another factor to be considered is that the sub-processes that compose the whole system may be managed and run by different agents, using different tools and information systems. It is often the case where multiple simulation models have been built, for different goals over time, and what is needed is a way to combine the results of these simulations. Hence, it is common for these sub-processes to be implemented by distinct simulator programs, which consume and generate different data types and features.

One or more embodiments of the invention mitigate the problem of modeling a complex domain by combining simpler simulations of a sequence of sub-processes into a single holistic simulation. A typical sequence of sub-processes may generate a result set that opens into a large search space for the combination of results given one or more target features. The computational costs of a naïve approach to this combination can be prohibitive, negatively impacting the response time of queries on this search space. On the other hand, in order to accurately support decisions, it is typically necessary to make sure that the combination of results from multiple sub-processes is coherent.

Combining Heterogeneous Simulations of a Same Sub-Process

Moreover, simulation applications implement vastly different simulation techniques, ranging from simple combinations of equations to complex separated elements simulated through a network of models, which includes discrete-event systems, petri nets (also known as a place/transition networks), system dynamics and other hybrid variations.

One or more embodiments of the invention tackle the combination of different simulations of a same sub-process. Simulation data generated from heterogeneous applications describing the same sub-process are quite common. One problem that arises is how to create unified representations that combine the results of these simulations in a way that provides more information about the behavior of that sub-process under diverse scenarios.

Combining Results of Previous Simulations of Portions of a Simulated Process

One or more embodiments of the invention provide methods and apparatus that provide a user with ways to query simulation results that have not been simulated in a single run, faster than what would it take to run the corresponding simulation, and without having to build a composite simulation model. Available results of partial simulations, or other data sources, are leveraged and extrapolated based on user-defined hypotheses to cover different scenarios. The partial results are optionally composed in an embarrassingly parallel manner so that it is possible to answer user queries in substantially real time.

One or more aspects of the invention comprise:

- a specialist user specifying features of the domain that are of interest and hypotheses about the relationship between them so that relevant user queries over these features can later be made;
- mapping results of each simulation program into an execution map format that is used to group and store the available data according to the user-defined features;
- combining execution maps related to the same sub-process into additional, richer, execution maps; and
- combining a sequence of execution maps in order to obtain a probability distribution function over a target feature, under user-specified constraints that define simulation scenarios.

Assume that a target feature t is a feature of the domain that drives the user queries. Let P be a sequence of sub-processes composed of ordered non-overlapping sub-processes $p_i$: $P=[p_1, p_2, \ldots, p_n]$; such that the sub-process $p_i$ comes after sub-process $p_{i-1}$. FIG. 1 illustrates an exemplary supply chain logistics domain 100 comprised of a sequence of sub-processes P (100) which is comprised of three sequential non-overlapping sub-processes $p_1$, $p_2$ and $p_3$. In the example of FIG. 1, sub-process $p_1$ is the placement of an order in the supply management system; $p_2$ is the warehouse and packaging operation; and $p_3$ is the transportation and delivery of goods to the destination.

In this example, an interesting feature of the domain for the user queries could be the average global lead time, that is, the average time that the supply chain takes to deliver orders at their requested destination. In the real-world, cases may comprise many target features and sub-processes.

Each sub-process $p_i$ is covered by one or more alternative data sources, and each data source may cover a sequence of sub-processes. A data source covering the sequence $p_i, p_{i+1}, \ldots, p_{i+k}$ is composed of multiple executions which implement $p_i, p_{i+1}, \ldots, p_{i+k}$ each. Data sources are typically the output of simulation programs for the sub-processes, but they can also correspond to real world data.

One or more embodiments of the invention produce the effect of a quick holistic simulation over the complete process taking advantage of the available data sources and is based on the following assumptions:

- the sequence P represents the intended simulation process for the domain, which is either unavailable or too costly;
- for each sub-process $p_i$, there is one or more result data sets (each one describing multiple executions of the sub-process) already stored;
- each execution comes from one simulation, or other source;
- all executions are independently computed or acquired;
- the user provides the relevant features of the domain for each sub-process involved and classifies them as either input or output features; and
- the executions representing a sub-process $p_i$ contain enough information to derive from them the input and output features of $p_i$.

In the present exemplary context, data sources generated by simulation programs that describe multiple executions are the focus, but the disclosed techniques also allow for the consideration of historical data, or even user-edit data, as applicable data sources.

Figure 2:
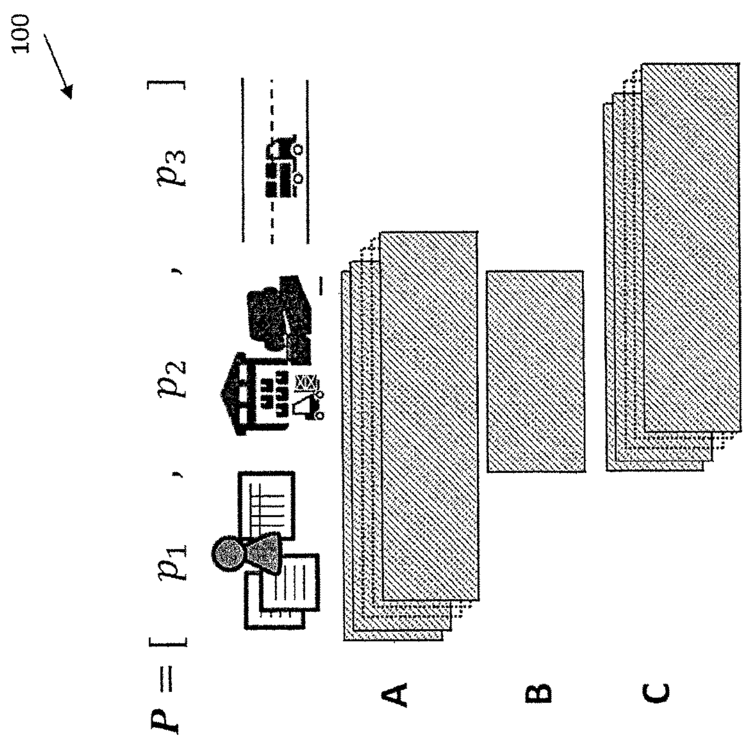
FIG. 2 illustrates three exemplary data sources for the exemplary supply chain logistics domain of FIG. 1.

FIG. 2 illustrates three exemplary data sources A, B and C for the exemplary supply chain logistics domain 100 of FIG. 1. The three exemplary data sources A, B and C correspond to one or more sub-processes $p_i$ of P. In the example of FIG. 2, data source A is a simulation program, the executions of which implement the order generation ($p_1$) and the warehouse operation ($p_2$) sub-processes. Data source B, on the other hand, is a database table recording historical data, the executions of which correspond only to the warehouse operation ($p_2$). Data source C is another simulation program, the executions of which correspond to the warehouse operation ($p_2$) and the transportation and delivery operation ($p_3$).

A data source could in principle correspond to a sequence of sub-processes if its executions generate outputs for each sub-process in the sequence. This means that executions from data source A, in FIG. 2, generate outputs representing the results of $p_1$ and $p_2$. For the sake of simplicity, and without loss of generality, it is assumed that each execution corresponds to a single sub-process. In this sense, the executions from data sources that implement multiple sub-processes are split into separate executions. Hence, the executions from source A in FIG. 2 are 'split' into executions that implement $p_1$ and executions that implement $p_2$.

Figure 3:
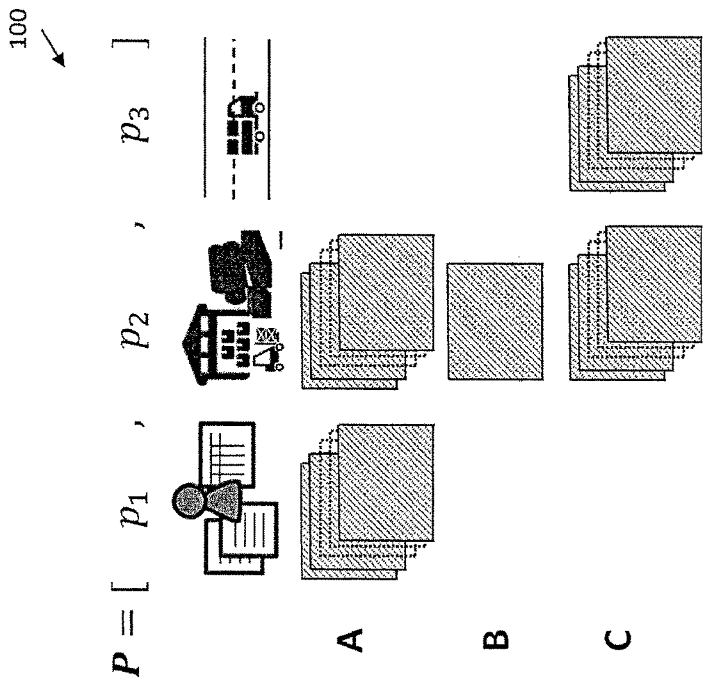
FIG. 3 illustrates the three data sources from the domain of FIG. 2 represented as executions that each implement only one sub-process.

FIG. 3 illustrates the three data sources A, B and C from the domain 100 of FIG. 2 represented as executions that each implement only one sub-process.

The following discussion provides an exemplary formalization of these concepts that is used herein. Let $\mathbb{D}$ be the set of all data sources and $\mathbb{E}$ be the set of all executions. For each data source $d \in \mathbb{D}$, define $\mathbb{E}_i^d$ is the set of all executions from d corresponding to sub-process $p_i$.

Consider that each execution $e \in \mathbb{E}$ operates consuming an n-tuple as input and generating an n-tuple as output. A tuple q is an ordered sequence of n values of features $T_j$, with $1 \leq j \leq n$, such that $q=(q_1, q_2, \ldots, q_n) \in T_1 \times T_2 \times \ldots \times T_n$. Let $\mathbb{T}(q)$ be the schema, that is, the composition of features $T_1 \times T_2 \times \ldots \times T_n$ for any given tuple q.

Let q be the input tuple for an execution $e \in \mathbb{E}$. $\mathbb{I}(e)$ is the input schema of e, defined by $\mathbb{I}(e) \underline{\underline{\text{def}}} \mathbb{T}(q)$. Similarly, let r be the output tuple fore. $\mathbb{O}(e)$ is the output schema of e, defined by $\mathbb{O}(e) \underline{\underline{\text{def}}} \mathbb{T}(r)$.

It is assumed that the executions originating from a same data source will substantially always have the same input and output features. This does not impose a constraint on the disclosed method, as it is possible to consider additional data sources. This means that for any data source d, all executions $e_i \in \mathbb{E}_i^d$ have the same input and output schemas $\mathbb{I}_i^d$ and $\mathbb{O}_i^d$, respectively. If this is not the case, the same effect can be achieved by considering a data source d whose executions present multiple input and output schemas as distinct data sources d', d", . . . , d*. This means splitting the set $\mathbb{E}_i^d$ into subsets $\mathbb{E}_i^{d\prime}$, $\mathbb{E}_i^{d\prime\prime}$, . . . , $\mathbb{E}_i^{*}$ in which the requirement is asserted.

Constructing Execution Maps from Simulation Results

An important aspect of the invention is that executions of a same sub-process may originate from distinct simulators. In fact, the disclosed method applies even for executions that originate from historical data, or other sources, including a combination of sources and many executions coming from the same source.

This section describes how executions of a same sub-process $p_i$ are aggregated into an execution map, which indexes the counted results of the executions by the input features used to generate them.

One or more embodiments of the disclosed method presume that a specialist user provides the input and output features that are relevant to each sub-process $p_i$. In the running example, it is assumed that relevant output features for process $p_1$, representing the order generation sub-process, are:

- avg_process_time: the average processing time for the orders;
- rt_containers: the container occupancy ratio; and
- urgency: a measure of how strictly deadlines need to be respected.

Figure 4:
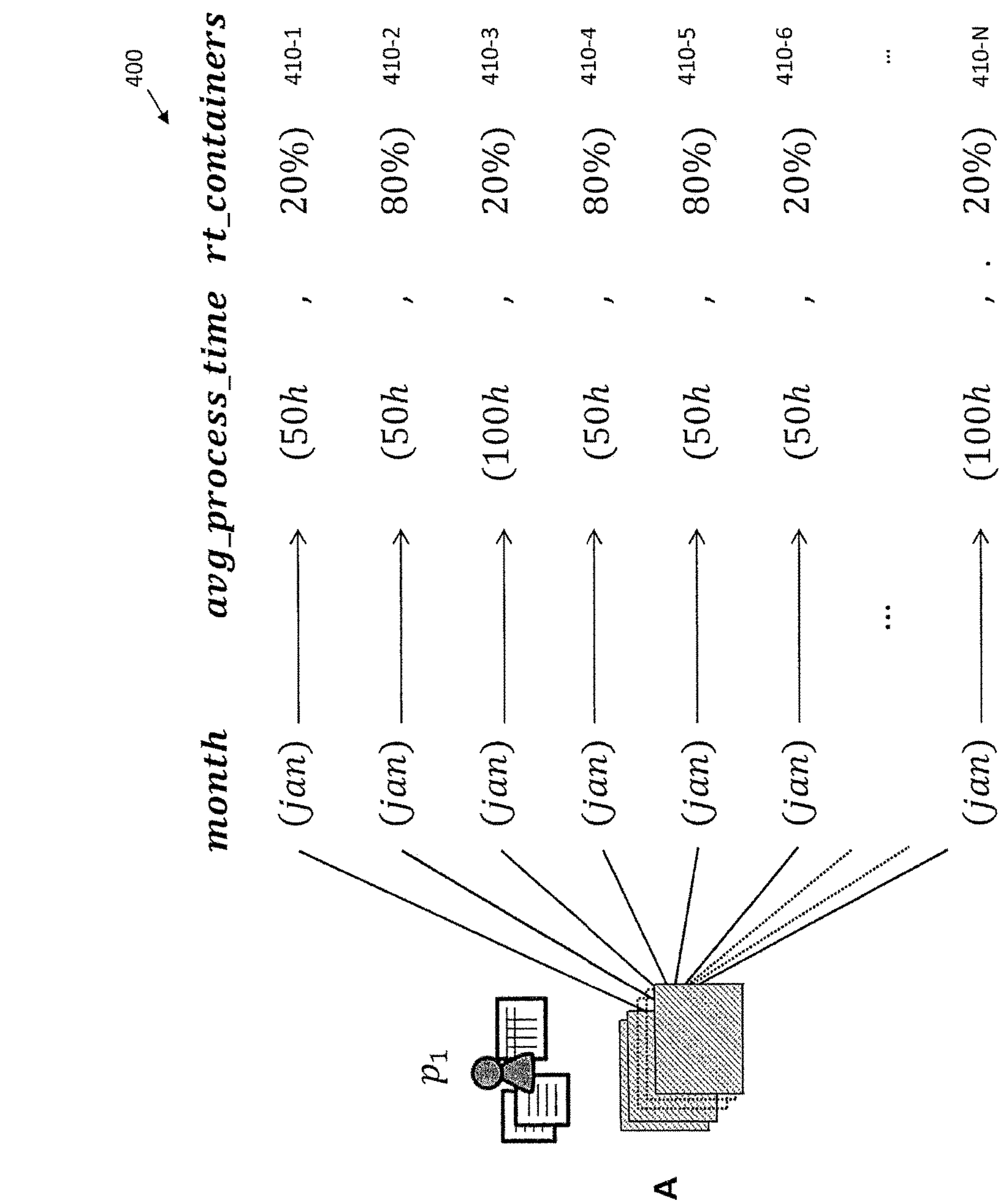
FIG. 4 illustrates an example with multiple executions of a sub-process, where all the executions come from the same simulator program.

Recall also that all executions of $p_i$ from a same data source have the same input and output schemas. FIG. 4 illustrates an example 400 with multiple executions of sub-process $p_1$, where all the executions come from the same simulator program A. Each result 410-1 through 410-N was generated given a value of the input feature month, and for each one, it is possible to compute values for the output features (avg_process_time, rt_containers).

One or more embodiments of the disclosed method thus require that the user provides a way of mapping the data in the logs of the executions to at least some features relevant for the domain. In the example of FIG. 4, the exemplary simulator was always executed with input data corresponding to the month feature value (jan), representing the sub-process of order generation in the month of January. Each execution produces, as part of its results 410, tuples such as (50 h, 20%), . . . , (100 h, 20%), depending on how workers handle the January incoming orders. The output tuple for each execution represents the average time (avg_process_time) of an order and the produced container occupancy (rt_containers) for the orders. Note that multiple executions with the same input (jan) might yield repeated results: the output tuple (50 h, 80%) was generated several times.

An execution map can be constructed of sub-process $p_i$ by source d defined as:

$$M_i^d : \mathbb{I}_i^d \rightarrow (\mathbb{N}, \mathbb{O}_i^d)$$

where $\mathbb{N}$ is the set of natural numbers. Put another way, an execution map $M_i^d$ contains the histogram of the results in executions $e_i \in \mathbb{E}_i^d$. FIG. 5 illustrates a table 500 comprising an execution map $M_1^A$ constructed from source A implementing sub-process $p_1$, following the example 400 of FIG. 4. Execution map 500 maps input tuples to resulting output tuples in sub-process $p_1$, extracted from simulator A as a single data source. As shown in FIG. 5, 45 executions of $p_1$ with the input tuple (jan) are presented with several resulting output tuples of the format (c, Q), where c is the count of the number of times a given output tuple appeared given the same input. Each time one of these output tuples appears, its respective counting number c is incremented in the execution map. Real-world applications would typically generate much larger numbers of distinct output tuples.

Recall now that executions of $p_1$ from other data sources can also provide information on the month, average process time and container occupancy ratio. These executions from multiple heterogeneous sources of a same sub-process can be combined to generate additional execution maps.

In the running example, suppose that a data source X (e.g., a database table) provides information on how the sub-process $p_1$ of order generation behaves on the months of January and February, generating the same output information. FIG. 6 illustrates a table 600 comprising an additional execution map $M_1^X$, extracted from a database table X, with equivalent input and output schemas to $M_1^A$.

The input and output schemas for maps $M_1^A$ and $M_1^X$ of FIGS. 5 and 6, respectively, are matching. Therefore, a map combining these data sources into an execution map $M_1^{AX}$ can also be generated, by adding the counts in the overlapping cases.

FIG. 7 illustrates a table 700 representing the execution map $M_1^{AX}$, composed from $M_1^A$ and $M_1^X$, of FIGS. 5 and 6, respectively, extracted from heterogeneous data sources.

In general, for every two execution maps $M_i^a$ and $M_i^b$ where $\mathbb{I}_i^a$ is similar to $\mathbb{I}_i^b$ and $\mathbb{O}_i^a$ is similar to $\mathbb{O}_i^b$, a new execution map $M_i^{ab}$ is generated by aggregating the executions in the original maps. A schema is said to be similar to another if they are substantially identical or there is a known function that can convert values from one to the other. For example, assume that there is a known function that can convert the week of the year to the corresponding month. Assume also a data source W, whose executions provide the input feature week_date, and the same output features of A and X. Then, W is similar to A, and is likewise similar to X and to AX. For the purpose of the disclosed exemplary method, terms like ab are referred to as a data source in the same way as a or b is referred to, even though this data source does not correspond to executions from a single simulator program or from a real-world database table. In other words, 'original' data sources and those composed from the other data sources with similar schemas are not distinguished.

Figure 8:
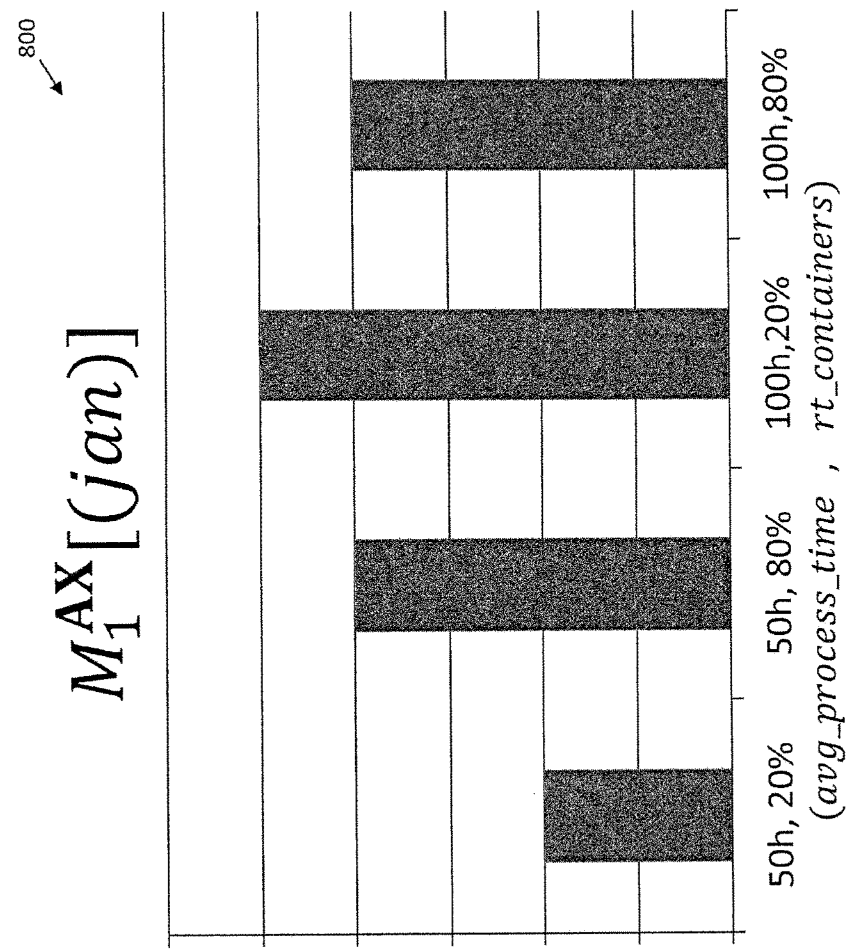
FIG. 8 illustrates a histogram of the output tuples of the results of a sub-process given by the input tuple (jan) in the execution map of FIG. 7.

The notation $M_i^d[q]$ refers to the resulting histogram obtained from the map $M_i^d$ from a given input tuple q. $M_i^d[q]$ is valid if q exists as input tuple in $M_i^d$, and invalid otherwise. FIG. 8 illustrates a histogram 800 of the output tuples of the results of a sub-process $p_1$ given by the input tuple (jan) in execution map $M_1^{AX}$ (700), following the previous example in FIG. 7.

It is noted that this input tuple (jan) may contain more features than there are in the input features of the execution map and still make $M_i^d[q]$ valid. For example, regardless of the value and meaning of R, $M_1^{AX}[(jan, R)]$ results in the same distribution as $M_1^{AX}[(jan)]$. It is further noted that the output features of $M_1^{AX}$ are a subset of the possible input and output features for sub-process $p_1$. Executions of the same sub-process from other data sources may provide information on different subsets of the features of the sub-process.

Assume, following the running example, that from executions of two other data sources Y and Z the features avg_process_time and urgency can be computed, but not rt_containers. Then, the results of Y and Z can be combined, but neither can be combined with either A, X, or AX. Thus, a map $M_1^{YZ}:\mathbb{I}_1^{YZ}\rightarrow(\mathbb{N},\mathbb{O}_1^{YZ})$ is ultimately generated from maps $M_1^{Y}$ and $M_1^{Z}$, since $\mathbb{I}_1^{Y}=\mathbb{I}_1^{Z}=\mathbb{I}_1^{YZ}$=(month), and $\mathbb{O}_1^{Y}=\mathbb{O}_1^{Z}=\mathbb{O}_1^{YZ}$=(avg_process_time, urgency).

Since executions from another data source may provide information on a different subset of output features of the sub-process, the end result is that for each unique pair of input and output schemas, a different execution map of sub-process $p_i$ should be generated. The specification of the input features of a sub-process determine what the user considers as variables that influence the executions of this sub-process. On the other hand, the output features correspond to the features that can be relevant for the following sub-processes.

In order to provide efficiency for the composition of execution maps, in one or more embodiments, execution maps are stored as distributed tables that use the input features to hash the data related to massive amount of executions across multiple nodes. In this way, it is possible to minimize data movement during the composition as described in the sequel.

Composition of a Target Feature Probability Distribution Function

After constructing the possible execution maps for all sub-processes, one or more embodiments can, at query time, generate a probability distribution function of a target feature that reproduces the effect of a simulation of the complete process. With this function at hand, the user can query values for the target feature in a specific provided scenario in real time, without the need to build or run a complex simulation that covers the entire process.

A probability distribution function pdf(x) is a function that returns, for each possible value of x, the probability in which x occurs. Here, the value x is of the type of the target features defined by the user query. For instance, if the user query is to know how long it would take to deliver a certain type of orders in a given period of the year, the target feature is the global lead time, i.e., the sum of all sub-process times in P, and the pdf(x) returns the probability for that amount of time to occur. Since the values recorded in execution maps, over which the algorithms defined below operate, are discrete, the method in fact builds a probability mass function, which gives the probabilities for discrete values of x. In case the target feature is continuous, an approximation can be generated for a continuous probability density function based on the probability mass function.

As discussed hereinafter, in one or more embodiments, a pdf composition method operates given a sequence of execution maps, one for each sub-process in P. In order to choose the best execution maps for each sub-process it is important to consider the confidence in the results of each map and the compatibility among results from the various sub-processes. It is noted that in the exemplary embodiments described herein, the execution map for each sub-process is assumed to be already selected.

FIG. 9 illustrates exemplary pseudo code of a compose process 900 according to one embodiment of the invention. The exemplary compose process 900, performs a pdf composition. In one or more embodiments, the exemplary compose process 900 receives the following user defined inputs:

- a target feature t, which is computed based on output features of the various sub-processes;
- a tuple scenario, that defines the initial scenario for the simulation of the values of the target feature. The scenario corresponds to values of features that condition the execution of the different sub-processes and are not generated from previous sub-processes;
- a list of execution maps mapSeq, that is a suitable sequence of execution maps, one for each sub-process, which substantially guarantees coherence of the results by matching the input features of each map with features either from the scenario or from output features of previous execution maps in the sequence or from composite features. It is required that all maps in the sequence be valid given the output tuples of the previous maps or input scenario; and
- a list of sets of merging functions funcs, which extends the execution maps by determining how composite features should be progressively computed as each execution map is considered by the algorithm. Composite features are considered additional output features that are dynamically computed based on a current value from previous sub-processes and values from the other output features of the execution map. The list funcs contains one set for each map in mapSeq. Each set defines merging functions for each composite feature f in the domain to be applied in the sub-process that the current execution map represents. This merging function can combine the previous value off with values from the output features of the current map to obtain a new partial value.

This list funcs therefore allows the user to define merging strategies for the features that change throughout the process. In a basic case, where the strategies remain the same, the list would contain the same set of functions repeated once for each map in mapSeq. Target features, such as the global lead time of the running example, correspond to the accumulation of values throughout the process and merging functions are used to progressively compute them.

The exemplary compose process 900 receives these inputs and returns the desired probability distribution function, pd f, during step 6.

As shown in FIG. 9, the exemplary compose process 900 comprises a call during step 4 to a recursive algorithm CombineHistogram, which combines the selected execution maps into a single histogram. Exemplary pseudocode for the CombineHistogram algorithm 1100 is discussed further below in conjunction with FIG. 11. The CombineHistogram algorithm 1100 requires three additional data structures, two of which are prepared by the exemplary compose process 900 during steps 1 through 3.

As shown in FIG. 9, during step 1, a call to CollectFeatures generates two exemplary auxiliary lists future_feat and next_feat. These two exemplary auxiliary lists are discussed further below in conjunction with FIG. 11.

In steps 2 and 3, the input scenario is changed into an 'initial scenario', representing a histogram of a single instance. In the exemplary compose process 900, and the auxiliary algorithms (processes) described below, histograms are tables with rows (c, F) where c is the count and F is itself a tuple of features.

The initial_hist (step 3) thus records a single occurrence of the provided initial_scenario. The initial_scenario tuple is given by the algorithm GenerateInitialScenario, which performs the necessary transformations on the scenario tuple given as argument, if any. An implementation of GenerateInitialScenario is presumed to be provided by the user in one or more embodiments, and not described further herein.

The resulting histogram is transformed during step 5 into a probability distribution function, pdf, by a Generate PDF process 1000, as discussed hereinafter in conjunction with FIG. 10.

FIG. 10 illustrates exemplary pseudo code of a Generate PDF process 1000 according to one embodiment of the invention. Generally, as shown in FIG. 10, given a histogram of values, hist, of the target feature as input, the exemplary GeneratePDF process 1000 generates a pdf from the histogram of values. The exemplary implementation of the GeneratePDF process 1000 applies normalization, although more complex implementations could interpolate the target feature values, as would be apparent to a person of ordinary skill in the art.

FIG. 11 illustrates exemplary pseudo code of a Combine Histogram process 1100 according to one embodiment of the invention. As noted above, the exemplary CombineHistogram process 1100 requires three additional data structures, two of which are prepared by the exemplary compose process 900 during steps 1 through 3. The exemplary compose process 900 generates, during step 1, two exemplary auxiliary lists future_feat and next_feat. List future_feat specifies the features obtained from each execution map that are necessary as input features for the remaining maps in the sequence. The exemplary CombineHistogram process 1100 uses future_feat during step 4 in order to group the intermediate histograms. This is important in order to prune the possibility space given by the combinatorial nature of the problem, and substantially guarantee computational efficiency.

The list next_feat corresponds to the input features of the next map of each map. List next_feat is used, during step 5, in a typical massively parallel implementation, to distribute intermediate results among computational nodes so that they can be efficiently combined with the following execution maps. This list is included in the definition of the algorithm as such information is important for data movement and load-balancing strategies, but such strategies are outside the scope of this invention.

As previously stated, the exemplary CombineHistogram process 1100 is a recursive algorithm. At each iteration, hist represents the current histogram, with the results of applying former maps to the initial scenario. In the first call, during step 3, hist corresponds to the initial scenario itself, as no maps have been applied.

Steps 1-2 contain the termination condition for the recursive calls. When there are no more maps in mapSeq, the algorithm returns the current histogram as the final result.

If there are still maps in mapSeq, the first map is removed from the list and stored as current_map by a call to the head algorithm during step 3. The head algorithm is presumed to return the first element of a list structure, as would be apparent to a person of ordinary skill in the art. The head algorithm is also applied over the future_feat list, to yield the current_feat variable, during step 4.

In step 5, a new histogram next_hist is initialized as an empty table. The input features of the next map in the sequence are informed so that they can be used to hash the results to be generated. The loop in steps 6-10 then populates this list with the results of combining the original histogram hist with the results in current_map.

The following operations (steps 8-10) are performed for every pair or tuples $(c_i, Q_i)$ and $(c_j, Q_j)$, where the first tuple comes from the input histogram and the second tuple is obtained from scenario map current_map given input $Q_i$. A new tuple $(c_n, Q_n)$ is generated and stored in the table next_hist through a call to append.

These operations are optionally a point of parallelism, since each pair of tuples can be independently considered. Enabling a high level of parallelism in the computation of the resulting tuples is essential for the real-time aspects of the disclosed method. As previously mentioned, the execution maps are stored in distributed tables that are hashed according to the values of the input features of the executions. Function append stores tuples in the new histogram using the input features of the next map to hash them. By using this strategy, the tuples in the histogram that will have to be joined with tuples of the next execution map will be in the same partition. In this way, this important operation can optionally occur in an embarrassingly parallel fashion.

The count for each tuple of the histogram is obtained by multiplying the counts of the original tuples. This means to represent the fact that each output in the input histogram causes each of the $c_j$ results obtained in current_map a $c_i$ number of times in the resulting histogram.

The resulting scenario tuple $Q_n$ is obtained by merging the input and output tuples $Q_i$ and $Q_j$, through a call during step 9 to an auxiliary function merge. This algorithm merges two tuples into one, using the tuples' schemas $\mathbb{T}(Q_i)$ and $\mathbb{T}(Q_j)$. The resulting tuple is an expansion of $Q_i$: the items of $Q_j$ with a feature that is not in $\mathbb{T}(Q_i)$ are appended to the resulting tuple.

The merge algorithm also uses the current set of merging functions, given by a call head(funcs). These merging functions can deal with features of $Q_i$ that should be updated according to values of features of $Q_j$. For each of these features, the corresponding function generates its value in the resulting scenario $Q_n$. Notice that this is typically useful to compute the target feature, which usually depends on contributions from various sub-processes. The current merging strategy for the target feature t determines how its value calculated so far is updated as the current execution map is combined. In the case of the running example, with global lead time as the target feature, the partial times of the sub-processes are accumulated. Other kinds of functions could be specified by users.

After the input histogram has been combined with the histograms obtained by the scenario map current_map, the resulting histogram is grouped by all the features during step 11 that are still necessary as inputs in the remainder of the sequence of execution maps mapSeq. This is achieved through a call to group_by with the second parameter bound to the structure current_feat (step 11).

The group_by algorithm called in step 11 receives two inputs: a histogram H and a list of features F. The group_by algorithm iterates over all elements (c, Q) in H, operating over the tuple Q. The group_by algorithm discards all items in Q whose features are not in F. Then, all elements $(c^1, Q)$, $(c^2, Q), \ldots, (c^m, Q)$ where tuples Q are the same are grouped into a single element (C, Q) where $$C = \sum_{i=1}^{m} c^i.$$

Notice that the execution of group_by is important to prune unnecessary tuples, and thus reduce the combinatorial nature of the process. Additionally, this is another phase of the algorithm that enables parallelism. As the histograms are distributed according to the values of input features of the next execution map, in one or more embodiments, which are a subset of current_feat, tuples that can be grouped are always on the same node and the operation occurs in an embarrassingly parallel fashion.

Finally, in step 12, the function 1100 returns the result of a recursive call. The arguments passed are the new distribution next_hist, and the tail of the lists, future_feat, next_feat and funcs (i.e., the remainder of such lists after discarding the first elements of each one).

Examples

FIGS. 12 through 20 present an example to illustrate the above-described algorithms of FIGS. 9 through 11. Assume a call to Compose with the following arguments:

- sequence mapSeq=[$M_1^{AX}$, $M_2^B$], where $M_1^{AX}$ is given in FIG. 7 and $M_2^B$ is shown in FIG. 12. FIG. 12 illustrates a table 1200 comprising an execution map $M_2^B$ constructed from source B. Notice that, for brevity, a process comprised by two sub-processes is assumed, instead of the original three of the running example;
- target feature t=lead_time;
- initial scenario=(jan), where j an is a value of the feature month.

The call to CollectFeatures (FIG. 9, Step 1) yields as future_feat the list: [(lead_time, rt_containers), (lead_time)]. Notice that the target feature will figure in every member of the future_feat list. The other feature, rt_containers, is part of the first item as that input is a necessary feature in map $M_2^B$.

The initial scenario is then obtained during Step 2 of FIG. 9 by a call to GenerateInitialScenario. Since the scenario provided is jan and the initial value for the target feature lead_time is assumed to be 0, the resulting histogram initial_scenario is of the form [(1, (jan, 0))].

A call is made during step 4 (FIG. 9) to CombineHistogram with the following arguments:

- hist: the initial scenario histogram, [(1, (jan, 0))];
- mapSeq: the list [$M_1^{AX}$, $M_2^B$];
- future_feat: the list [(lead_time,rt_containers), (lead_time)];
- next_feat: the list [(month), (rt_containers)]; and
- funcs: a list of the necessary merging functions, where the first element is the set of functions applicable in $M_1^{AX}$.

In the CombineHistogram algorithm 1100 (FIG. 11), this first iteration reaches the end of the loop in steps 6-10 with the histogram next_hist as the histogram obtained from W (FIG. 7) given input jan.

Figure 13:
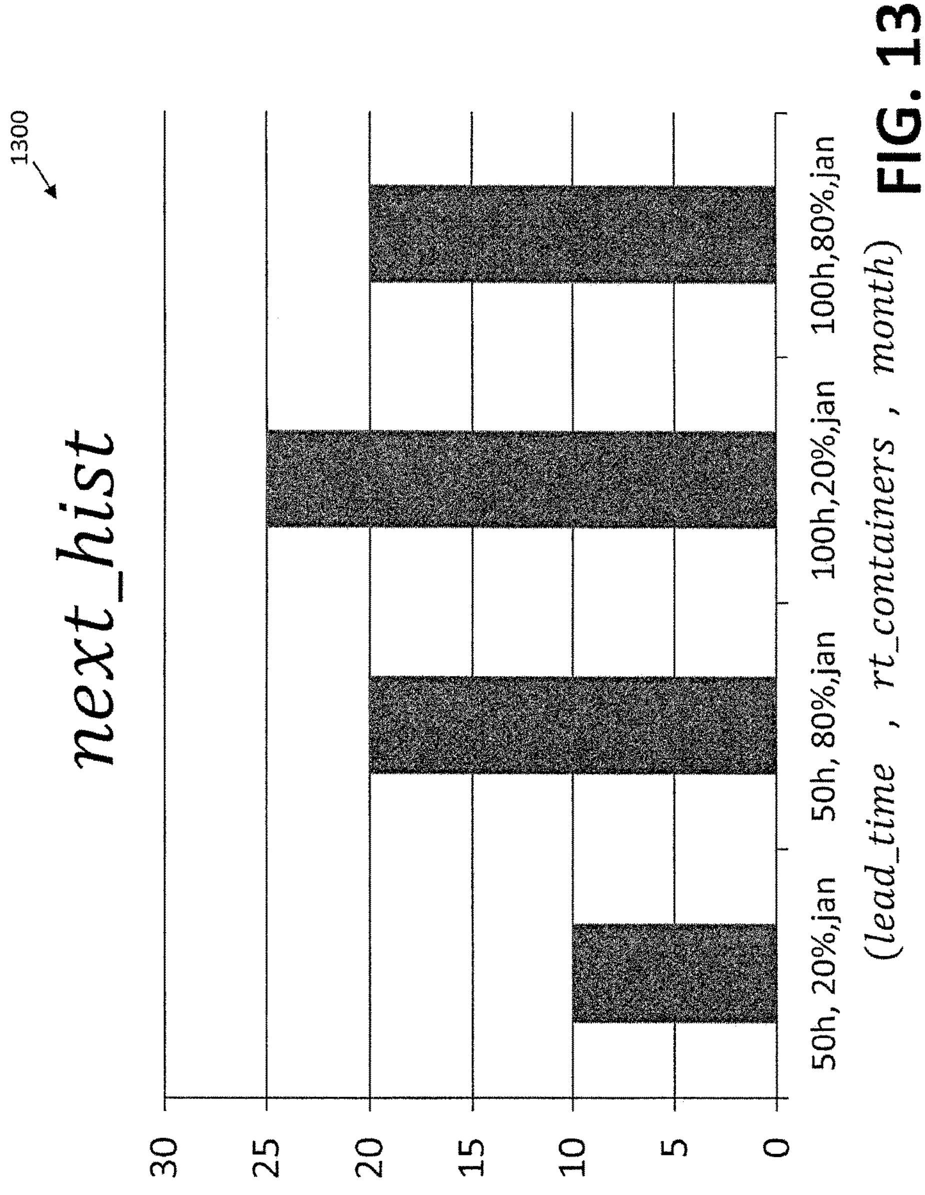

FIG. 13 illustrates a histogram 1300 of the output tuples of the results of a sub-process $p_1$ propagating the input feature month in execution map $M_1^{AX}$ (700 of FIG. 7). The histogram 1300 of FIG. 13 is similar to the histogram 800 for $M_1^{AX}$[jab], shown in FIG. 8, with the only difference being that the tuples contain a feature month with the value jan. Also notice that, since the target feature lead_time in the maps is given by the avg_processing_time, the the merging function yields a tuple where the lead_time is the sum of the previous value of lead_time and the avg_processing_time in the map. In this case, since the initial value for the lead_time is zero, that value is the avg_processing_time of the order generation sub-process obtained in $M_1^{AX}$[jan].

In step 11 of FIG. 11, next_hist has its elements grouped by (lead_time, rt_containers), which are the current_feat that were removed from the input_feat in step 4. This is done through a call to the algorithm group_by. In the present example, the elements in next_hist have items with feature month, which is not a member of current_feat. Thus, these items are dropped from the tuples. As this does not result in duplicate tuples, no additional aggregation is performed, and the dropping of values jan from the histogram next_hist is the only effect over next_hist.

Figure 14:
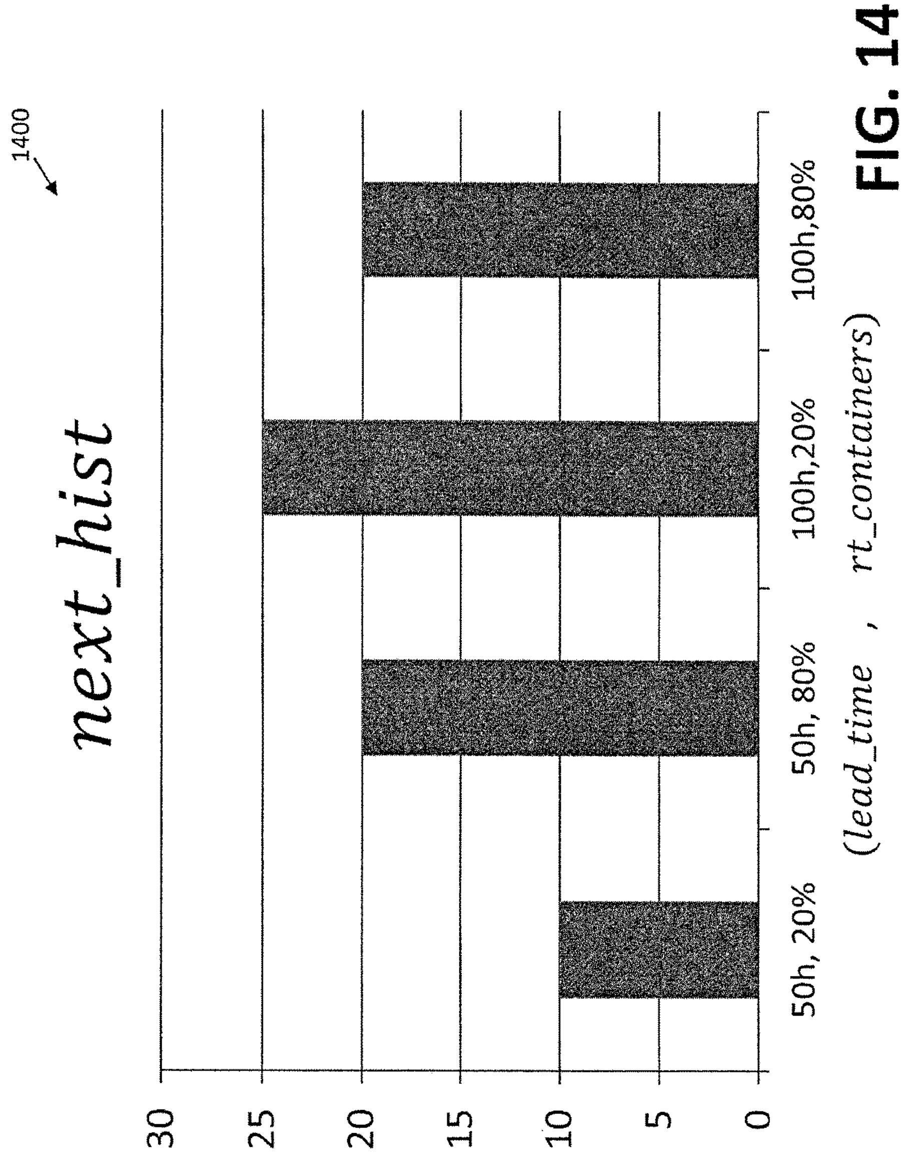

FIG. 14 illustrates the resulting histogram 1400, after the group_by operation of step 11 of FIG. 11. The feature month is dropped from the tuples in the resulting histogram 1400, as the month feature is not a necessary input feature for the remaining maps in the sequence (e.g., $M_1^B$).

Now, a second level call to the CombineHistogram algorithm 1100 (FIG. 11) is made.

This call has arguments:

- hist: the histogram computed so far (previous next_hist), in the following form:

[(10, (50 h, 20%)), (20, (50 h, 80%)), (25, (100 h, 20%)), (20, (100 h, 80%))], where each element (c, Q) is composed of a count value and a tuple Q such that $\mathbb{T}$(Q)=(lead_time, rt_containers);

- mapSeq: the list [$M_2^B$];
- future_feat: the list [(lead_time)];
- next_feat: the list [(rt_containers)]; and
- funcs: a list of the necessary merging functions, where the first and only element is the set of functions applicable in $M_2^B$.

Recall map $M_2^B$ (1200), given in FIG. 12. The execution map in table 1200 represents the distributions 1500 and 1550 of the results of a sub-process $p_2$ executed by given the inputs (20%), in FIG. 15A, and (80%), in FIG. 15B, respectively.

Given the above inputs, the CombineHistogram algorithm 1100 (FIG. 11) (in steps 6-11) composes the resulting histogram. For each value of rt_containers in tuples of hist that are in $M_2^B$ (steps 6-7), a merged sample is calculated (steps 8-9) and stacked in a resulting histogram (step 10).

In order to represent that each instance of a result in sub-process $p_1$ leads to multiple possible sequences in sub-process $p_2$, each matching scenario has the count values multiplied. In the present example, this represents that every execution of sub-process $p_1$ in January leads to many possible results in sub-process $p_2$.

Figure 15A:
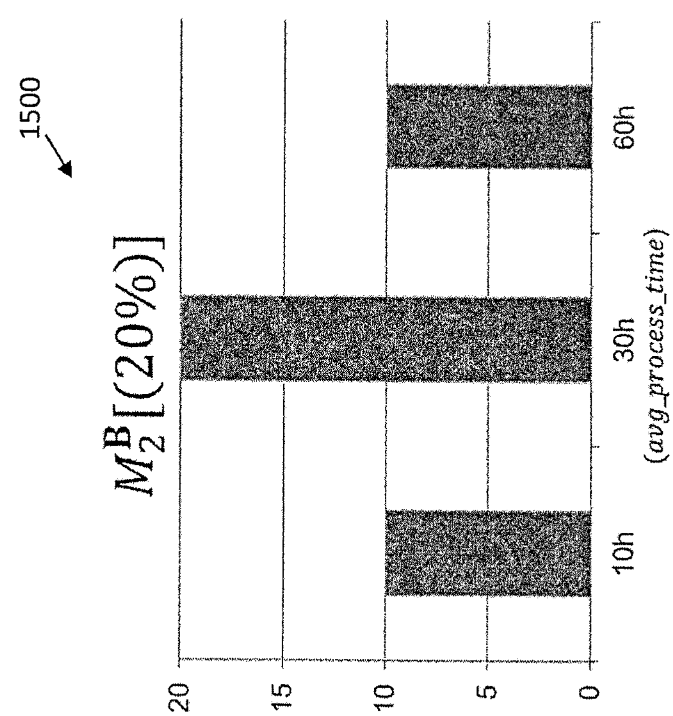
Figure 15B:
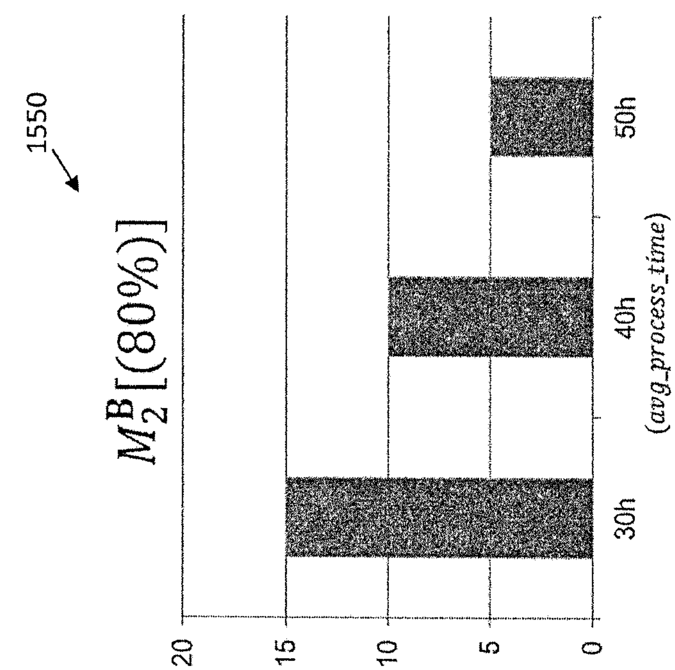
Figure 16:
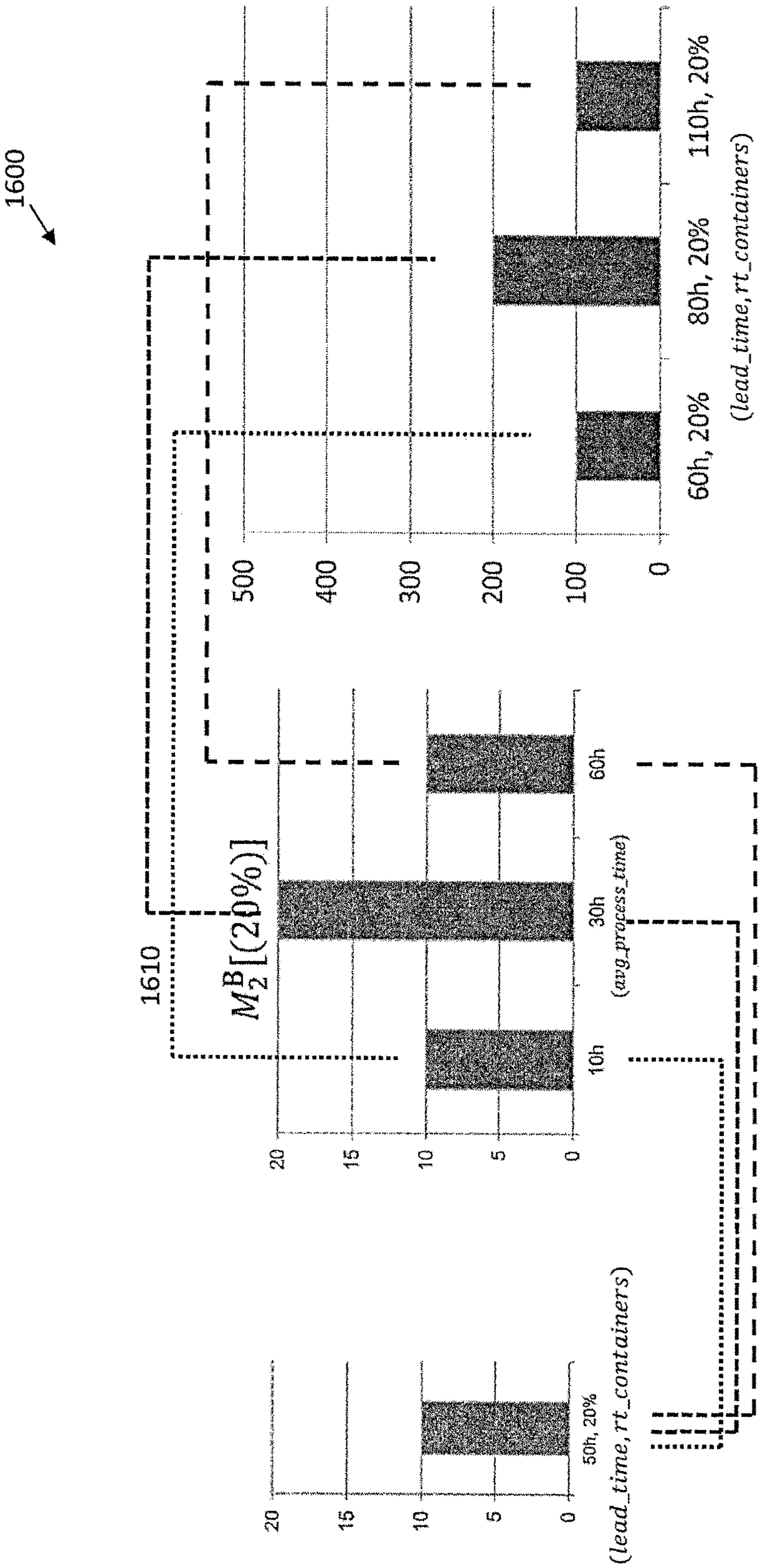

This means that the count value of each bar in the histogram 1400 of FIG. 14 is multiplied by the count value of each bar in the appropriate distribution 1500, 1550 in FIGS. 15A and 15B. Additionally, it is necessary to consider the composition rule for the values of the target feature. In the example, since the target feature is the lead time given in all of the execution maps by the (avg_processing_time), this composition is done by adding the partial values of lead_time, in the histogram to the value of avg_processing_time in the histogram of the current map. For example, the <50 h, 20%> result in FIG. 14 is combined with the distribution of FIG. 15A. FIG. 16 is a visual representation of the histogram composition 1600 where the counts are multiplied and the values for the target feature lead_time are generated by the sum of lead_time in the input histogram and avg_process_time in the histogram of the current map, $M_2^B$[(20%)].

For example, the multiplication 1610 of the 10 counts of <50 h, 20%> by the 10 counts of <10 h> yield a count of a 100 situations where the lead time is 60 h and the container occupancy is 20%. The tuple <60 h, 20%> is obtained by adding the values of the target feature (50 h to 10 h), as stated above.

Figure 17A:
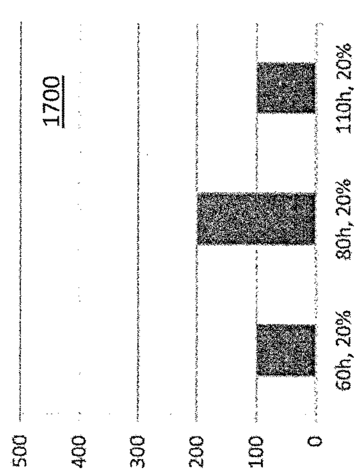
Figure 17B:
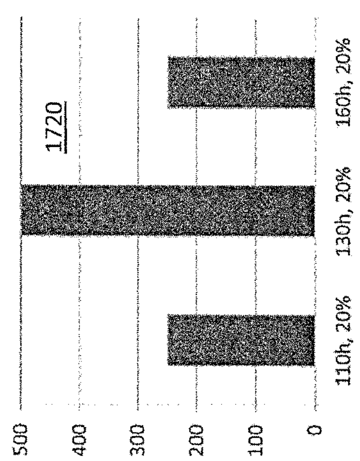
Figure 17C:
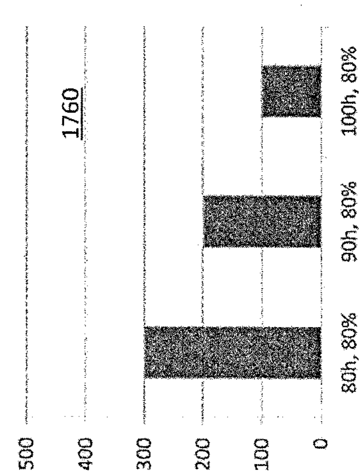
Figure 17D:
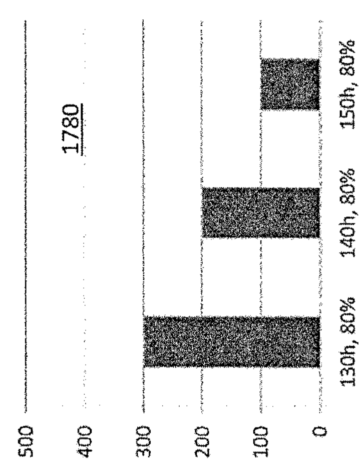

FIGS. 17A through 17D show the partial resulting distributions 1700, 1720, 1760, 1780 for various combinations of execution maps. FIGS. 17A and 17B illustrate the partial resulting distributions 1700, 1720 combining $M_1^{AX}$ [(jan)] (800, FIG. 8) with $M_2^{B}$[(20%)] (1500, FIG. 15A). FIGS. 17A and 17B illustrate the partial resulting distributions 1760, 1780 combining $M_1^{AX}$[(jan)] (800, FIG. 8) with $M_2^{B}$[(80%)] (1550, FIG. 15B).

Figure 18:
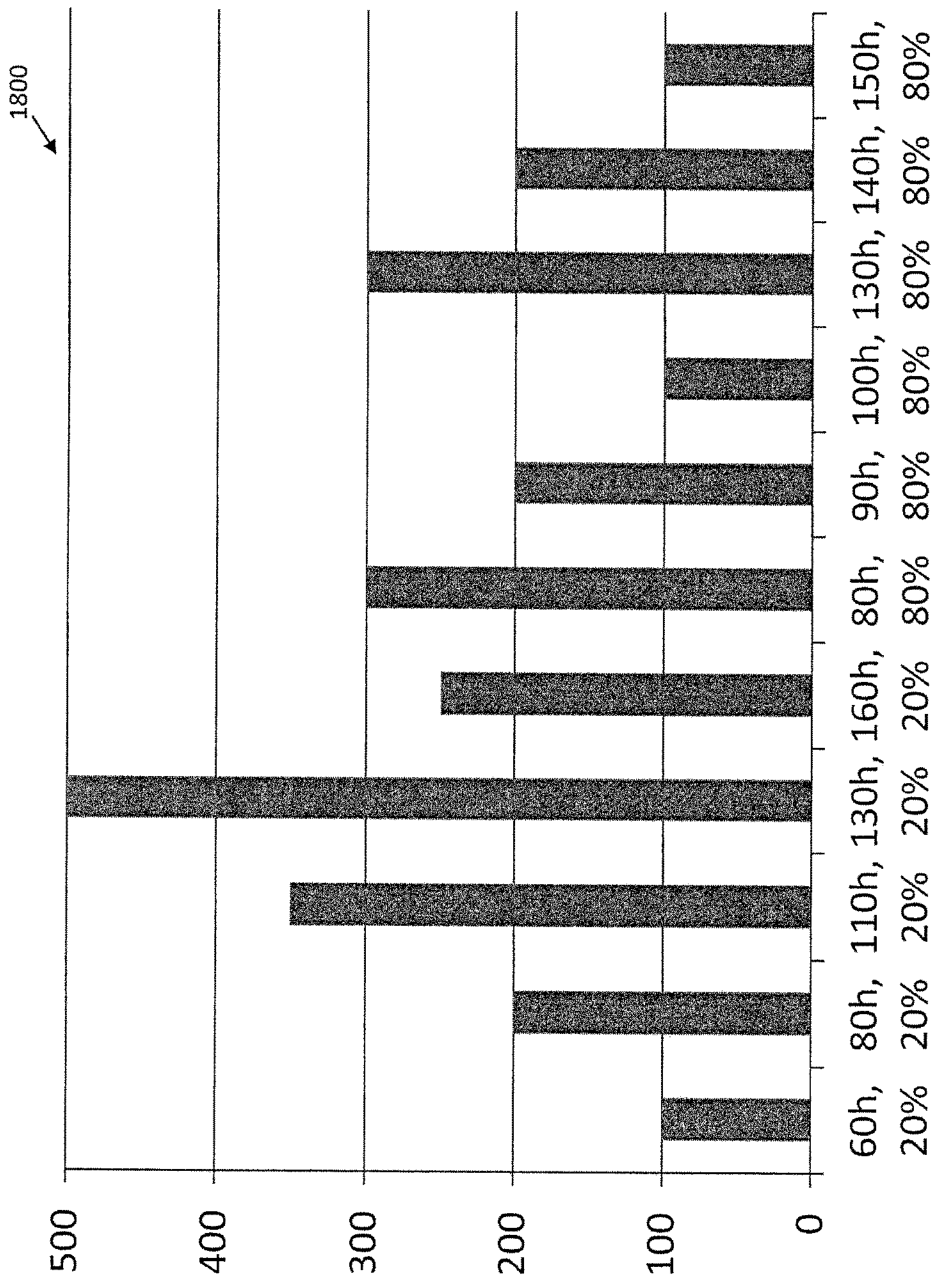

Notice that some of the partial results in FIGS. 17A through 17D represent the same cases. For example, the tuple <110 h, 20%> is present in both FIGS. 17A and 17B. The aggregated resulting distribution 1800 is shown in FIG. 18, combining $M_1^{AX}$[(jan)] (800, FIG. 8) with $M_2^{B}$[(20%)] (1500, FIG. 15A) and $M_1^{AX}$[(jan)] (800, FIG. 8) with $M_2^{B}$[(80%)] (1550, FIG. 15B). The counts for both occurrences of <110 h, 20%>, for example, have been aggregated.

In at least one embodiment, the method 1100 would then proceed by combining this resulting distribution with the distributions given in an execution map selected for sub-process $p_3$. Because the tuples in this distribution still have a feature rt_containers, the values of 20% and 80% can still be used as input for that map, even if those values were not generated by the last map in the sequence. That is to say, the information on the 'current scenario' is propagated throughout the combination of sub-processes.

Figure 19:
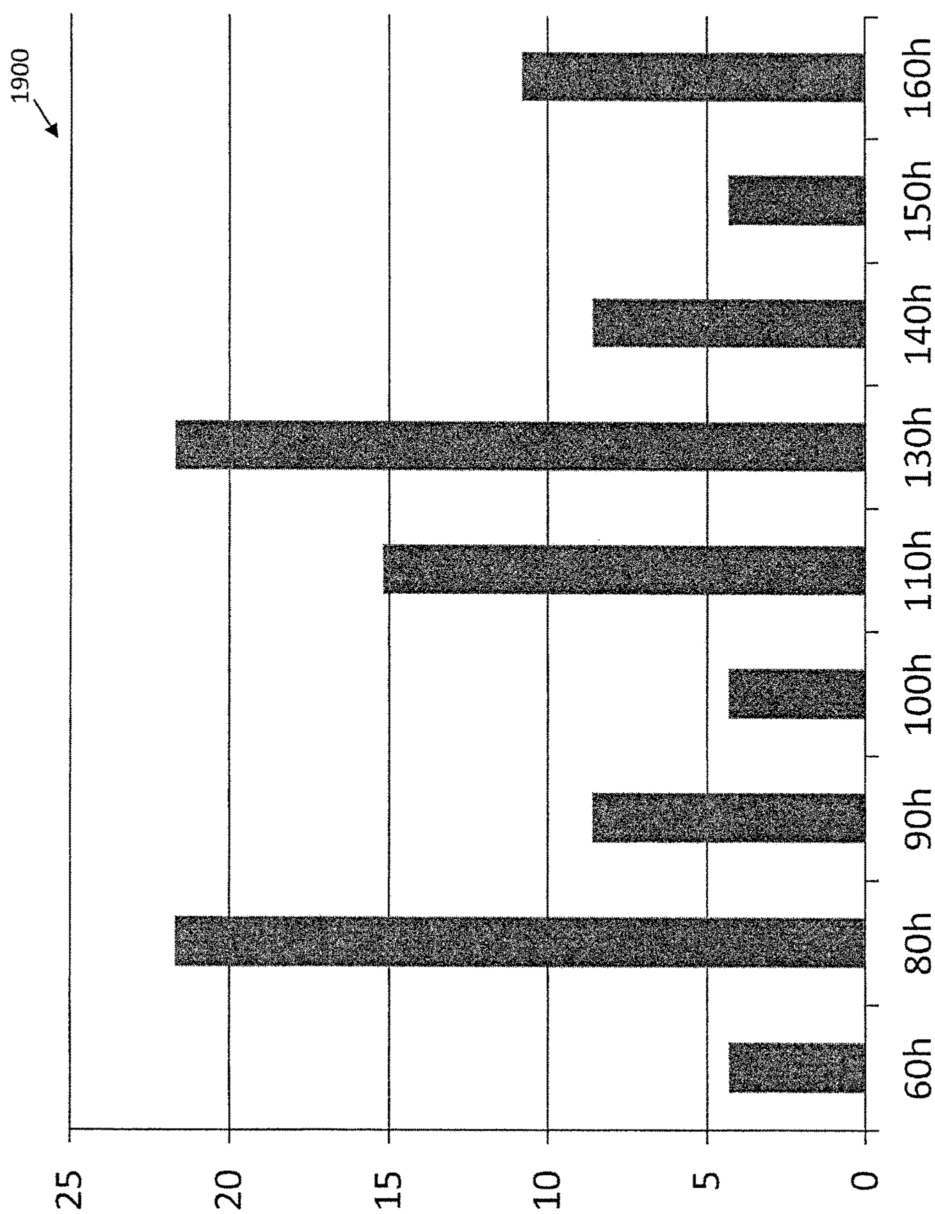

Suppose, however, that it is known that rt_containers is not required as input for any of the remaining maps to be combined. This would be the case, for example, if $M_2^{B}$ were the last map in the sequence. The aggregated resulting distribution 1900 is shown in FIG. 19, combining $M_1^{AX}$ [(jan)] (800, FIG. 8) with $M_2^{B}$[(20%)] (1500, FIG. 15A) and $M_1^{AX}$([(jan)] (800, FIG. 8) with $M_2^{B}$[(80%)] (1550, FIG. 15B).

Figure 20:
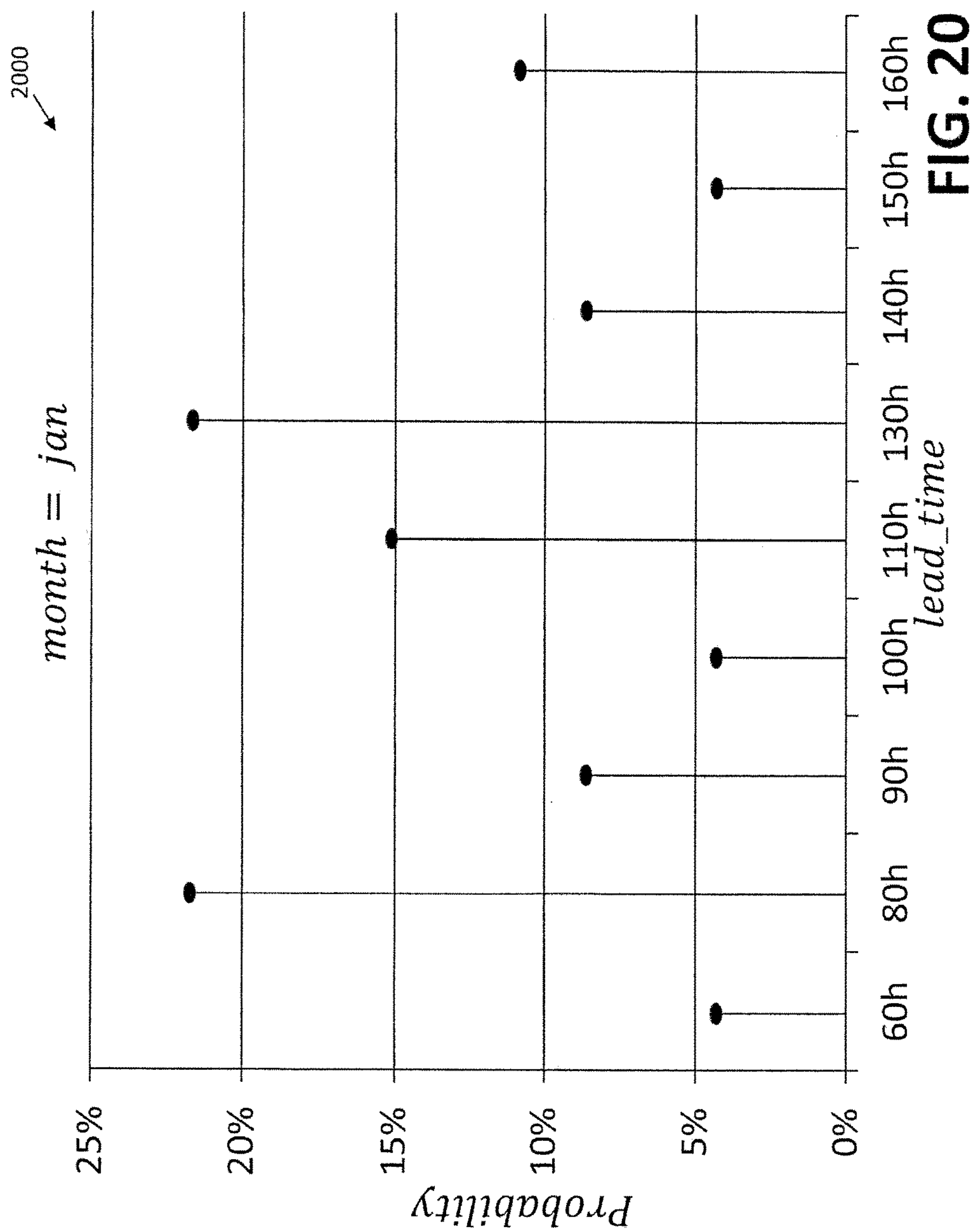

The final distribution produced by the combination of all maps in the sequence is substantially always the counts of values of the target feature. After trivial normalization, this distribution results in a probability distribution function of the resulting values of the target feature after the entire sequence of sub-process has taken place. FIG. 20 illustrates the resulting probabilities 2000 for values of the lead time in the complete process, given that the process starts in the month of January.

Supply Chain Logistics

In the context of supply chain management for various industries, such as oil and gas exploration and production and health care, there are usually thousands of types of materials to be delivered taking into account a large number of sub-processes. There are multiple policies within each sub-process and dealing with all combinations poses a huge combinatorial problem. Creation of detailed simulation models in these contexts is very time consuming. In addition, simulations that cover all the most likely scenarios might need to generate multiple terabytes of data and take days to be generated and analyzed.

By using the techniques described herein, results can be estimated for scenarios that have never been simulated orders of magnitude more quickly than by executing complete simulations. In addition, even when there is no complete simulation model, results can still be obtained by combining partial results. The resulting probability distribution function of the target variable tends to provide much better analytical and predictive insights when compared to simple reports based on historical data, such as global averages or other statistical measurements, because it is generated based on results of the specific scenario the user wants to query.

Scientific and Engineering Workflows

In Scientific and Engineering workflows, various simulation models are usually executed and chained as part of a same workflow and the execution of which could take many weeks. By using the disclosed methods, previous executions of the same workflow in other scenarios can be used to answer queries in due time when it is not viable to execute the complete workflow.

In addition, partial results of the execution of a workflow can be used to predict the final result. This can be useful in particular when some level of user steering is necessary to verify whether parameters of the simulations are correct so that predicted results make sense. In case a problem is detected, processes can be interrupted earlier and restarted correctly.

Conclusion

In complex domains, such as supply chain management, industrial processes optimization and many others from scientific and engineering areas, the simulation of scenarios to accurately obtain distribution probabilities of target features is usually necessary to support decision making. Very often, such simulations take a long time to be computed and generate massive data sets to be analyzed. In addition, unified simulation models may not be available for the whole process available.

One or more embodiments of the invention generate results for the simulation of new scenarios when there is a lack of time to perform complete simulations. In addition, at least one embodiment of the invention supports decisions when there is no unified simulation model available, but there are massive heterogeneous simulation results (or historic data) from different parts of a process. A massively parallel method is optionally performed for the automatic combination of large volumes of simulation results and other heterogeneous data sources based on user-defined hypothesis about the relationship between sub-processes. Such a combination allows the user to extrapolate available results in order to quickly obtain distribution probabilities of target variables in new scenarios, even when there is no unified simulation model available. The disclosed method substantially guarantees the coherence of the distribution probabilities with such hypothesis. In this way, the better the hypotheses are, the closer the obtained distributions to what would be observed in the real world or provided by complete simulations of scenarios.

The foregoing applications and associated embodiments should be considered as illustrative only, and numerous other embodiments can be configured using the techniques disclosed herein, in a wide variety of different applications.

It should also be understood that the techniques for combining results of previous simulations of portions of a simulated process, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed techniques for combining results of previous simulations of portions of a simulated process may be implemented using one or more processing platforms. One or more of the processing modules or other components may therefore each run on a computer, storage device or other processing platform element. A given such element may be viewed as an example of what is more generally referred to herein as a "processing device."

Figure 21:
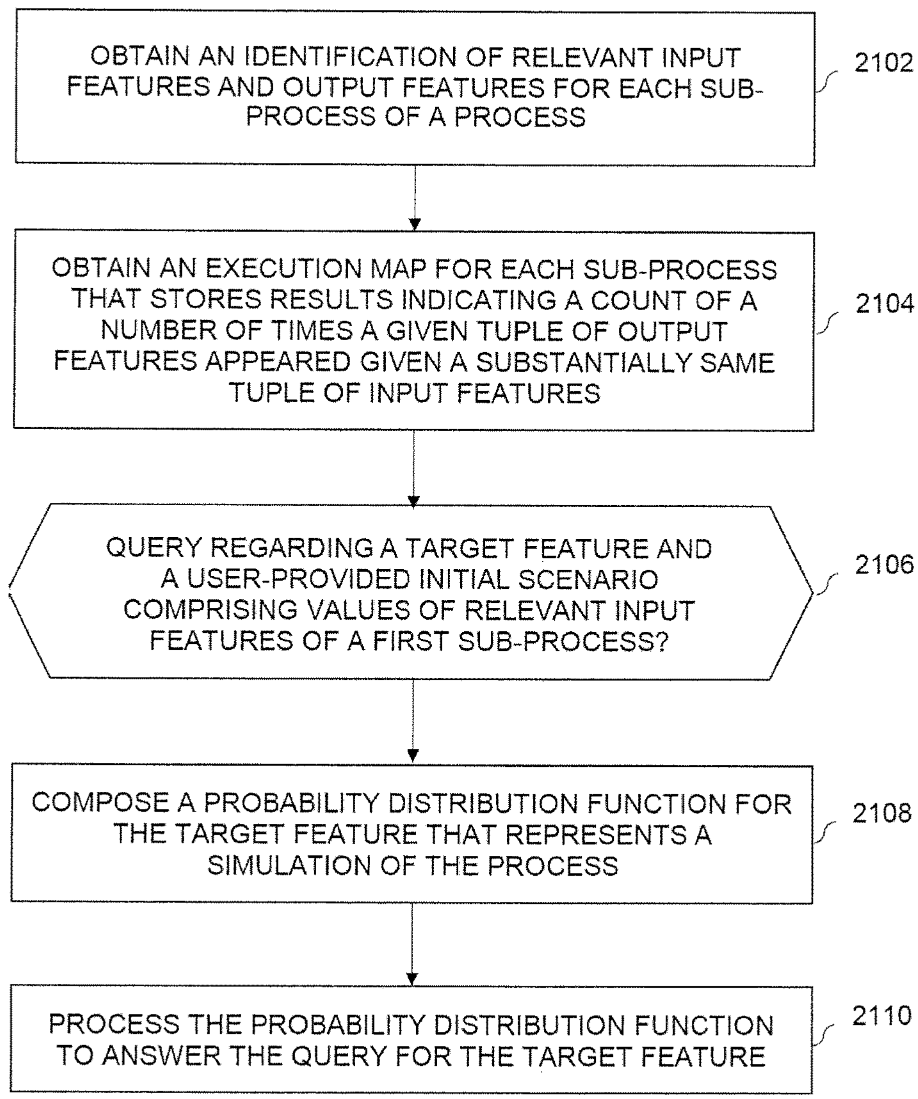
FIG. 21 illustrates a flowchart of a process according to an example embodiment of the subject matter described herein.

Referring now to FIG. 21, this figure illustrates a flowchart of a process according to an example embodiment.

Step 2102 of the process includes obtaining, for a process comprised of a sequence of a plurality of sub-processes, an identification of one or more relevant input features and output features for each of said sub-processes. Step 2104 includes obtaining at least one execution map for each of said sub-processes, wherein each execution map stores results of at least one execution of a given sub-process originated from at least one data source, and wherein said results indicate a count of a number of times a given tuple of output features appeared given a substantially same tuple of input features. Steps 2108 and 2110 are performed in response to one or more user queries regarding at least one target feature, selected among features of the sub-processes, and a user-provided initial scenario comprising values of the one or more relevant input features of a first sub-process as indicated by 2106. Step 2108 includes composing a probability distribution function for said at least one target feature that represents a simulation of the process based on a sequence of said execution maps, one for each of said sub-processes, by matching the input features of each execution map with features from either the initial scenario or from the output of previous execution maps in the sequence. Step 2110 includes processing said probability distribution function to answer said one or more user queries for said at least one target feature.

Figure 22:
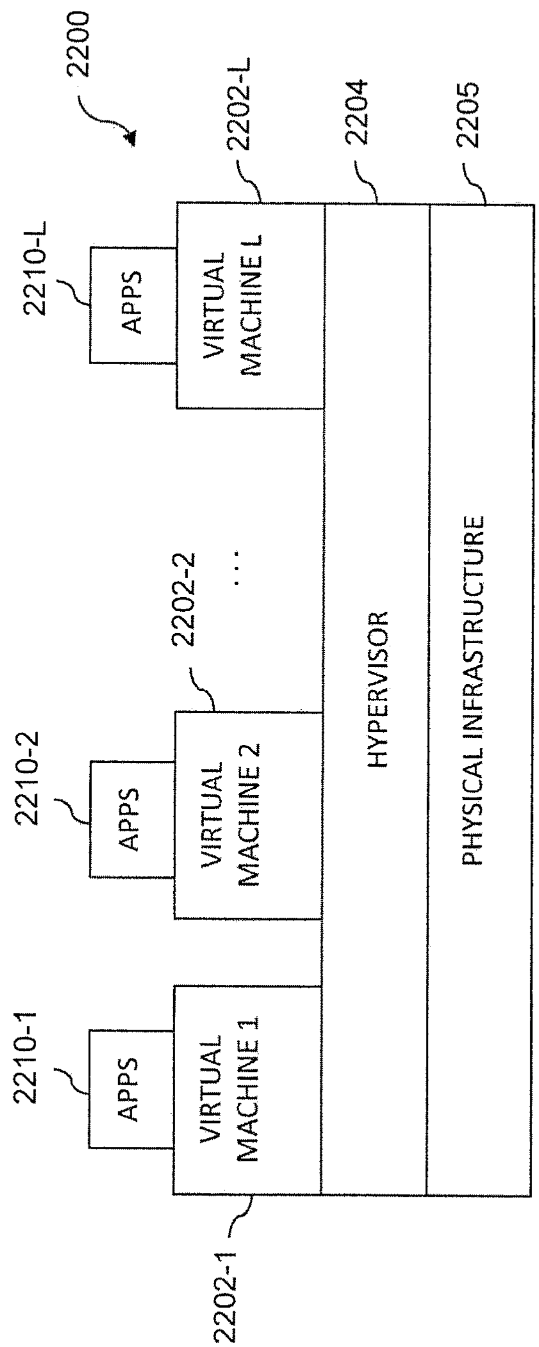
FIG. 22 illustrates an exemplary processing platform that may be used to implement at least a portion of one or more embodiments of the invention comprising a cloud infrastructure.

Referring now to FIG. 22, one possible processing platform that may be used to implement at least a portion of one or more embodiments of the invention comprises cloud infrastructure 2200. The cloud infrastructure 2200 in this exemplary processing platform comprises virtual machines (VMs) 2202-1, 2202-2, . . . 2202-L implemented using a hypervisor 2204. The hypervisor 2204 runs on physical infrastructure 2205. The cloud infrastructure 2200 further comprises sets of applications 2210-1, 2210-2, . . . 2210-L running on respective ones of the virtual machines 2202-1, 2202-2, . . . 2202-L under the control of the hypervisor 2204.

The cloud infrastructure 2200 may encompass the entire given system or only portions of that given system, such as one or more of client, servers, controllers, or computing devices in the system.

Although only a single hypervisor 2204 is shown in the embodiment of FIG. 22, the system may of course include multiple hypervisors each providing a set of virtual machines using at least one underlying physical machine.

An example of a commercially available hypervisor platform that may be used to implement hypervisor 2204 and possibly other portions of the system in one or more embodiments of the invention is the VMware® vSphere™ which may have an associated virtual infrastructure management system, such as the VMware® vCenter™. The underlying physical machines may comprise one or more distributed processing platforms that include storage products, such as VNX™ and Symmetrix VMAX™, both commercially available from EMC Corporation of Hopkinton, Mass. A variety of other storage products may be utilized to implement at least a portion of the system.

In some embodiments, the cloud infrastructure additionally or alternatively comprises a plurality of containers implemented using container host devices. For example, a given container of cloud infrastructure illustratively comprises a Docker container or other type of LXC. The containers may be associated with respective tenants of a multi-tenant environment of the system, although in other embodiments a given tenant can have multiple containers. The containers may be utilized to implement a variety of different types of functionality within the system. For example, containers can be used to implement respective compute nodes or cloud storage nodes of a cloud computing and storage system. The compute nodes or storage nodes may be associated with respective cloud tenants of a multi-tenant environment of system. Containers may be used in combination with other virtualization infrastructure such as virtual machines implemented using a hypervisor.

Figure 23:
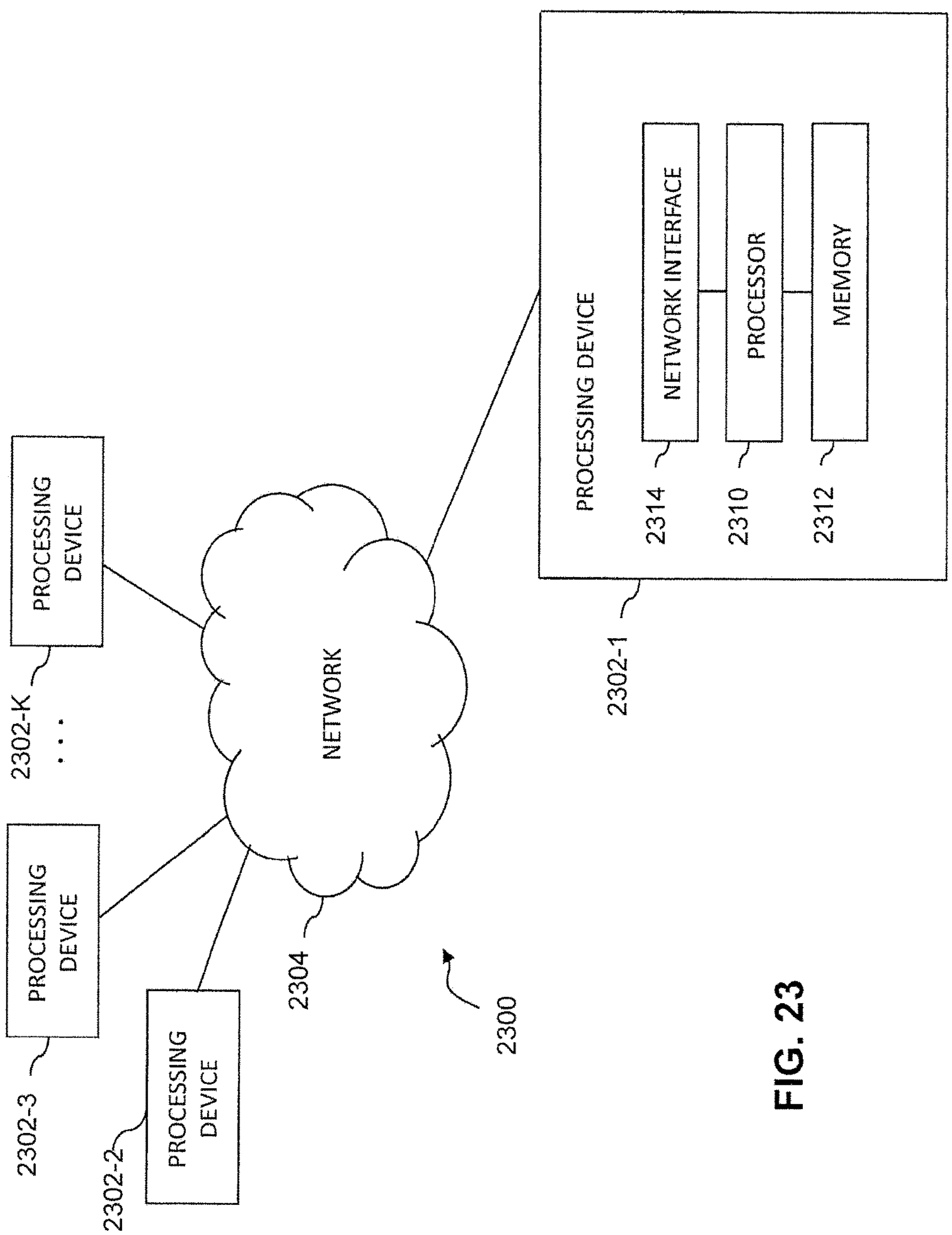
FIG. 23 illustrates another exemplary processing platform that may be used to implement at least a portion of one or more embodiments of the invention.

Another example of a processing platform is processing platform 2300 shown in FIG. 23. The processing platform 2300 in this embodiment comprises at least a portion of the given system and includes a plurality of processing devices, denoted 2302-1, 2302-2, 2302-3, . . . 2302-K, which communicate with one another over a network 2304. The network 2304 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 2302-1 in the processing platform 2300 comprises a processor 2310 coupled to a memory 2312. The processor 2310 may comprise a microprocessor, a microcontroller, an application specific integrated circuit (ASIC), a field programmable gate array (FPGA) or other type of processing circuitry, as well as portions or combinations of such circuitry elements, and the memory 2312, which may be viewed as an example of a "computer program product" having executable computer program code embodied therein, may comprise random access memory (RAM), read only memory (ROM) or other types of memory, in any combination.

Also included in the processing device 2302-1 is network interface circuitry 2314, which is used to interface the processing device with the network 2304 and other system components, and may comprise conventional transceivers.

The other processing devices 2302 of the processing platform 2300 are assumed to be configured in a manner similar to that shown for processing device 2302-1 in the figure.

Again, the particular processing platform 2300 shown in the figure is presented by way of example only, and the given system may include additional or alternative processing platforms, as well as numerous distinct processing platforms in any combination, with each such platform comprising one or more computers, storage devices or other processing devices.

Multiple elements of system may be collectively implemented on a common processing platform of the type shown in FIG. 22 or 23, or each such element may be implemented on a separate processing platform.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

Also, it should again be emphasized that the above-described embodiments of the invention are presented for purposes of illustration only. Many variations and other alternative embodiments may be used. For example, the disclosed techniques are applicable to a wide variety of other types of communication systems, storage systems and processing devices. Accordingly, the particular illustrative configurations of system and device elements detailed herein can be varied in other embodiments. These and numerous other alternative embodiments within the scope of the appended claims will be readily apparent to those skilled in the art.

What is claimed is:

1. A method, comprising the steps of:

obtaining, for a process comprised of a sequence of a plurality of sub-processes, an identification of one or more relevant input features and output features for each of said sub-processes;

obtaining at least one execution map for each of said sub-processes, wherein each execution map stores results of at least one execution of a given sub-process originated from at least one data source, and wherein said results indicate a count of a number of times a given tuple of output features appeared given a substantially same tuple of input features; and in response to one or more user queries regarding at least one target feature, selected among features of the sub-processes, and a user-provided initial scenario comprising values of the one or more relevant input features of a first sub-process, performing the following steps:

composing a probability distribution function for said at least one target feature that represents a simulation of the process based on a sequence of said execution maps, one for each of said sub-processes, by matching the input features of each execution map with features from either the initial scenario or from the output of previous execution maps in the sequence; and processing said probability distribution function to answer said one or more user queries for said at least one target feature.

2. The method of claim 1, wherein additional composite output features are generated during said composing of said probability distribution function, and said at least one target feature is selected among said additional composite output features.

3. The method of claim 1, wherein said at least one data source comprises one or more of a simulator of at least one sub-process, historical data and user-edited data.

4. The method of claim 3, further comprising the step of combining execution maps from a plurality of heterogeneous data sources of a same sub-process to generate additional execution maps.

5. The method of claim 1, further comprising the step of verifying compatibility between execution maps in the sequence, by assuring that the values of the output features that are input features of a next map in said sequence are matching.

6. The method of claim 1, wherein said at least one execution map for each of said plurality of sub-processes are stored as distributed tables that use the one or more relevant input features to hash data related to multiple executions across multiple nodes.

7. The method of claim 6, wherein said composing occurs in parallel across multiple nodes.

8. The method of claim 1, wherein said probability distribution function comprises a probability mass function and wherein, when one or more of said at least one target feature are continuous, said method further comprising the step of generating an approximation for a continuous probability density function based on the probability mass function.

9. The method of claim 1, wherein said probability distribution function enables said one or more user queries regarding one or more of said at least one target feature to be processed for said process when said process has not been simulated in a single run.

10. The method of claim 1, wherein said probability distribution function for the at least one target feature is generated from said at least one execution map for each of said sub-processes selected based on a confidence level of the results in each execution map.

11. A computer program product, comprising a tangible machine-readable storage medium having encoded therein executable code of one or more software programs, wherein the one or more software programs when executed by at least one processing device cause the at least one processing device to perform at least the following steps:

obtaining, for a process comprised of a sequence of a plurality of sub-processes, an identification of one or more relevant input features and output features for each of said sub-processes;

obtaining at least one execution map for each of said sub-processes, wherein each execution map stores results of at least one execution of a given sub-process originated from at least one data source, and wherein said results indicate a count of a number of times a given tuple of output features appeared given a substantially same tuple of input features; and in response to one or more user queries regarding at least one target feature, selected among features of the sub-processes, and a user-provided initial scenario comprising values of the one or more relevant input features of a first sub-process, performing the following steps:

composing a probability distribution function for said at least one target feature that represents a simulation of the process based on a sequence of said execution maps, one for each of said sub-processes, by matching the input features of each execution map with features from either the initial scenario or from the output of previous execution maps in the sequence; and processing said probability distribution function to answer said one or more user queries for said at least one target feature.

12. The computer program product of claim 11, wherein additional composite output features are generated during said composing of said probability distribution function, and said at least one target feature is selected among said additional composite output features.

13. The computer program product of claim 11, wherein the one or more software programs when executed by the at least one processing device cause the at least one processing device to perform combining execution maps from a plurality of heterogeneous data sources of a same sub-process to generate additional execution maps.

14. The computer program product of claim 11, wherein the one or more software programs when executed by at least one processing device cause the at least one processing device to perform verifying compatibility between execution maps in the sequence, by assuring that the values of the output features that are input features of a next map in said sequence are matching.

15. The computer program product of claim 11, wherein said at least one execution map for each of said plurality of sub-processes are stored as distributed tables that use the one or more relevant input features to hash data related to multiple executions across multiple nodes and wherein said composing occurs in parallel across multiple nodes.

16. A system, comprising:

a memory; and at least one processing device, coupled to the memory, operative to implement the following steps:

obtaining, for a process comprised of a sequence of a plurality of sub-processes, an identification of one or more relevant input features and output features for each of said sub-processes;

obtaining at least one execution map for each of said sub-processes, wherein each execution map stores results of at least one execution of a given sub-process originated from at least one data source, and wherein said results indicate a count of a number of times a given tuple of output features appeared given a substantially same tuple of input features; and in response to one or more user queries regarding at least one target feature, selected among features of the sub-processes, and a user-provided initial scenario comprising values of the one or more relevant input features of a first sub-process, performing the following steps:

composing a probability distribution function for said at least one target feature that represents a simulation of the process based on a sequence of said execution maps, one for each of said sub-processes, by matching the input features of each execution map with features from either the initial scenario or from the output of previous execution maps in the sequence; and processing said probability distribution function to answer said one or more user queries for said at least one target feature.

17. The system of claim 16, further comprising the step of combining execution maps from a plurality of heterogeneous data sources of a same sub-process to generate additional execution maps.

18. The system of claim 16, wherein said at least one execution map for each of said plurality of sub-processes are stored as distributed tables that use the one or more relevant input features to hash data related to multiple executions across multiple nodes, and wherein said composing occurs in parallel across multiple nodes.

19. The system of claim 16, wherein said probability distribution function comprises a probability mass function and wherein, when one or more of said at least one target feature are continuous, further comprising the step of generating an approximation for a continuous probability density function based on the probability mass function.

20. The system of claim 16, wherein said probability distribution function for the at least one target feature is generated from said at least one execution map for each of said sub-processes selected based on a confidence level of the results in each execution map.

* * * * *